(12) United States Patent
Ouchi et al.

(10) Patent No.: US 8,087,135 B2
(45) Date of Patent: Jan. 3, 2012

(54) METHOD OF MANUFACTURING A PIEZOELECTRIC VIBRATOR

(75) Inventors: Keiichi Ouchi, Chiba (JP); Yuki Hoshi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/792,167

(22) Filed: Jun. 2, 2010

(65) Prior Publication Data

US 2010/0237739 A1 Sep. 23, 2010

Related U.S. Application Data

(63) Continuation of application No. PCT/JP2008/069108, filed on Oct. 22, 2008.

(30) Foreign Application Priority Data

Dec. 4, 2007 (JP) ................................ 2007-313513
Jan. 29, 2008 (JP) ................................ 2008-017932

(51) Int. Cl.
*H04R 17/10* (2006.01)
(52) U.S. Cl. ............. 29/25.35; 29/830; 29/417; 29/593; 29/846; 438/58; 438/471; 310/312; 310/344; 310/370
(58) Field of Classification Search ................ 29/25.35, 29/827, 830, 417, 593, 846; 438/58, 471, 438/476; 310/312, 322, 344, 370
See application file for complete search history.

(56) References Cited

U.S. PATENT DOCUMENTS

| | | | | |
|---|---|---|---|---|
| 4,051,582 A | * | 10/1977 | Eschler et al. | 29/25.35 |
| 4,107,349 A | * | 8/1978 | Vig | 29/25.35 X |
| 6,707,351 B2 | * | 3/2004 | Gorrell | 312/312 X |
| 2003/0168944 A1 | | 9/2003 | Shimizu et al. | |
| 2007/0046151 A1 | * | 3/2007 | Aratake | 310/344 |

FOREIGN PATENT DOCUMENTS

| | | | |
|---|---|---|---|
| GB | 2067009 A | 7/1981 | |
| JP | 54124692 A | * 9/1979 | ............... 29/25.35 X |
| JP | 56-098015 A | 8/1981 | |
| JP | 2003-142976 A | 5/2003 | |
| JP | 2007-081697 A | 3/2007 | |
| JP | 2007-267101 A | 10/2007 | |

OTHER PUBLICATIONS

International Search Report for International Application No. PCT/JP2008/069108, dated Dec. 16, 2008, 1 page.

* cited by examiner

*Primary Examiner* — A. Dexter Tugbang
(74) *Attorney, Agent, or Firm* — Brinks Hofer Gilson & Lione

(57) ABSTRACT

A piezoelectric vibrator manufacturing method includes a cavity forming step for forming depressions for a cavities on at least one of two wafers; a bonding electrode film forming step for forming bonding electrode films on bonded surfaces of the both wafers; a mount pattern forming step for forming a pair of mount patterns in the cavity; a through hole forming step for forming a pair of through holes in the cavity; a through electrode forming step for forming a pair of through electrodes electrically connected with the pattern in the cavity; a mount step for electrically connecting the pattern and a piezoelectric vibrating strip, a superimposing step for superimposing the both wafers and storing getter materials; a bonding step for anodically bonding the both wafers to fabricating a wafer member; a gettering step for adjusting the degree of vacuum in the interior of the cavity while measuring a series resonance resistance value; and a cutting step for cutting the wafer member into individual pieces.

16 Claims, 25 Drawing Sheets

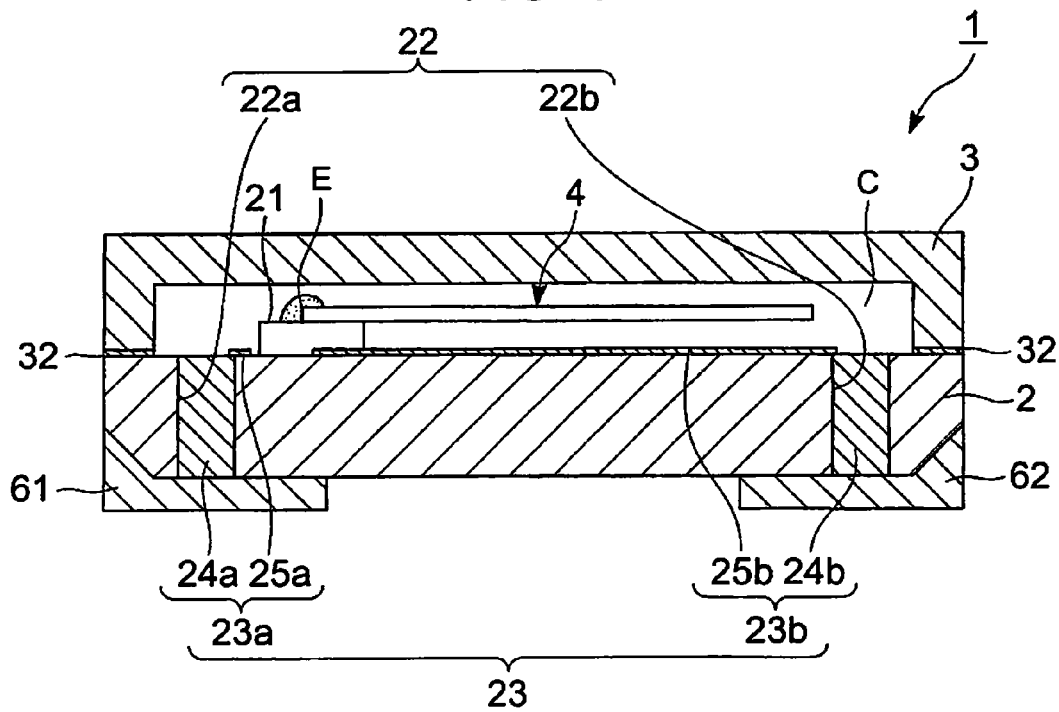
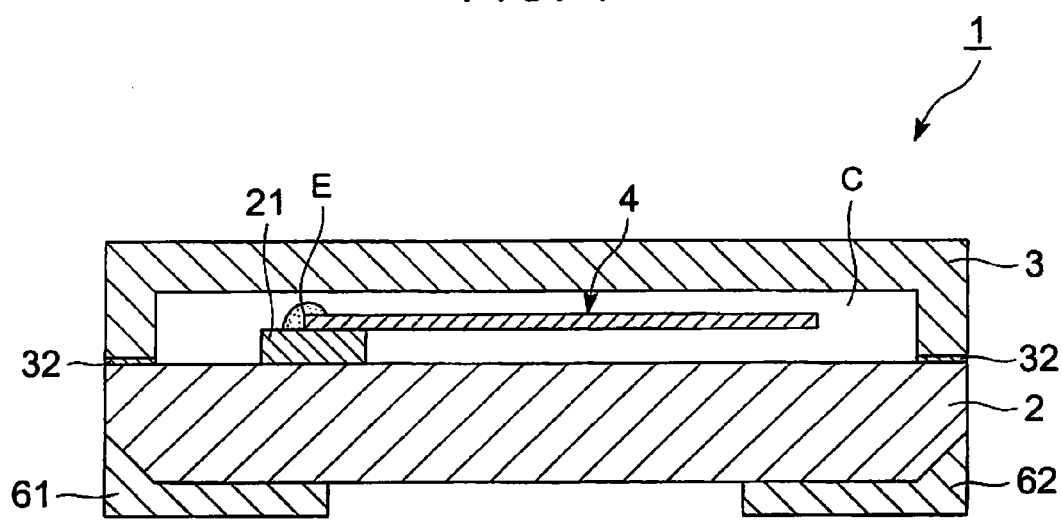

METHOD OF MANUFACTURING A PIEZOELECTRIC VIBRATOR

RELATED APPLICATIONS

This application is a continuation of PCT/JP2008/069108 filed on Oct. 22, 2008, which claims priority to Japanese Application Nos. JP2007-313513 filed on Dec. 4, 2007 and 2008-017932 filed on Jan. 29, 2008. The entire contents of these applications are incorporated herein by reference.

BACKGROUND OF THE INVENTION

The present invention relates to a piezoelectric vibrator manufacturing method for manufacturing a piezoelectric vibrator of a surface mount device (SMD) type in which the piezoelectric vibrator is encapsulated in a cavity formed between bonded two substrates, a piezoelectric vibrator manufactured in this manufacturing method, and an oscillator, electronic apparatus, and a radio clock having this piezoelectric vibrator.

In recent years, a piezoelectric vibrator using crystal or the like is used as a time instance source, a timing source for control signals, and a reference signal source in mobile phone sets or portable information terminal devices. There are provided various types of such piezoelectric vibrators, and a piezoelectric vibrator of a surface mount device (SMD, Surface Mount Device) type is known as one of these piezoelectric vibrators. As the piezoelectric vibrator of this type, a three-layer structure type in which a base substrate and a lid substrate are bonded to a piezoelectric substrate formed with a piezoelectric vibrating strip thereon so as to interpose the same therebetween from above and below is generally known. In this case, the piezoelectric vibrating strip is stored in a cavity (sealed chamber) formed between the base substrate and the lid substrate.

Also, in recent years, there is also developed a two-layer structure type instead of the three-layer structure type described above. A piezoelectric vibrator of this type has a two-layer structure having a base substrate and a lid substrate bonded directly to each other, and a piezoelectric vibrating strip is stored in a cavity formed between the both substrates. The piezoelectric vibrator of the two-layer structure type is superior in that reduction in thickness is achieved, for example, in comparison with those having the three-layer structure, and is preferably used.

Incidentally, an electrode film for electrically connecting an external electrode formed on the base substrate and the piezoelectric vibrating strip stored in the cavity is formed between the base substrate and the lid substrate (bonded surface). Also, the base substrate and the lid substrate are bonded via anodic bonding using this electrode film. In other words, the electrode film is used as a bonding film for applying a voltage at the time of the anodic bonding. Because of this anodic bonding, the piezoelectric vibrating strip is in a state of being reliably encapsulated within the cavity.

As the electrode film, for example, a conductive film such as aluminum or chrome, or a semiconductor film such as silicon is used. Insulative substrates such as glass (soda lime glass) are used as the base substrate and the lid substrate.

The piezoelectric vibrator is generally manufactured as follows.

First of all, a plurality of depressions which serve as the cavities are formed on a base substrate wafer which is formed into the base substrates, and the electrode film which also serves as the bonding film used at the time of the anodic bonding is patterned from the depressions to the bonded surface. Then, a plurality of depressions which serve as the cavities are formed on a lid substrate wafer which is formed into the lid substrates. Then, after having mounted the piezoelectric vibrating strips in the depressions formed on the base substrate wafer, the lid substrate wafer is superimposed on the bonded surface of the base substrate wafer. Then, the both wafers are bonded via the anodic bonding by utilizing the electrode film to form a piezoelectric vibrator wafer member. Thereafter, by cutting the piezoelectric vibrator wafer member with a dicing blade into small pieces in a grid-like pattern, individual piezoelectric vibrators are obtained. Then, finally, by forming the external electrode on the base substrate, the piezoelectric vibrator of the surface mount device type is manufactured.

Incidentally, the piezoelectric vibrator is generally desired to have an equivalent resistance value (effective resistance value, Re) reduced to a low value. The piezoelectric vibrator having the low equivalent resistance value is able to vibrate the piezoelectric vibrating strip at a low power, and hence the piezoelectric vibrator having high energy efficiency is achieved.

As a general method of reducing the equivalent resistance value, a method of bringing the interior of the cavity in which the piezoelectric vibrating strip is encapsulated near under vacuum is known. In other words, by bringing the interior of the cavity near under the vacuum, a series resonance resistance value (R1) which is in proportion to the equivalent resistance value can be lowered. In other words, the degree of vacuum in the interiors of the cavity and the series resonance resistance value are in inverse proportion.

Then, as a method of adjusting the degree of vacuum in order to bring the interior of the cavity near under the vacuum, a method of storing a getter material such as aluminum in the cavity, and activating the getter material by irradiating the same with a laser from outside by a gettering adjusting machine (gettering adjustment) is known. In this method, since oxygen generated at the time of the anodic bonding can be absorbed by the getter material in an activated state, the interior of the cavity is brought near under the vacuum.

As the method of bringing the interior of the cavity near under the vacuum, a method of arranging a moisture adsorbent in the cavity is also known (for example, see Patent Document 1). This method is a method applied when bonding the lid substrate and the base substrate with an adhesive agent instead of the anodic bonding, and enables the interior of the cavity to be brought near under the vacuum by adsorbing moisture entering from the outside into the cavity through the adhesive agent by the moisture adsorbent.

Incidentally, a nominal frequency is determined generally for the piezoelectric vibrator. This nominal frequency is a value which guarantees a frequency when a predetermined voltage is applied to the piezoelectric vibrating strip. In other words, the respective piezoelectric vibrating strips are needed to be adjusted in frequency so as to vibrate within a range of the nominal frequency when the voltage is applied.

Therefore, the frequency adjustment for the piezoelectric vibrating strips is performed. In general, as a method of the frequency adjustment, there are a coarse adjustment step performed after having manufactured the piezoelectric vibrating strip and a fine adjustment step performed after having encapsulated the piezoelectric vibrating strip in the cavity. Specifically, in the fine adjustment step, it is necessary to adjust the frequency of the piezoelectric vibrating strip adequately so as to cause the piezoelectric vibrating strip in a state of a product to vibrate within the range of the nominal frequency, and hence it is necessary to perform the frequency adjustment while measuring the frequency of the piezoelectric vibrating strip. In other words, it is necessary to vibrate the piezoelectric vibrating strip encapsulated in the cavity by applying a predetermined voltage thereto.

Patent Document: JP-A-56-98015

SUMMARY OF THE INVENTION

However, the adjustment of the degree of vacuum in the interior of the cavity in the related art, that is, the gettering adjustment and the frequency adjustment still have following problems, respectively.

First of all, in the gettering adjustment in the related art has the following problem.

In other words, although the degree of vacuum can be adjusted by absorbing the oxygen in the interior of the cavity by irradiating the getter material (for example, a metallic film such as aluminum) with the laser as described above, it is necessary to perform the gettering adjustment while measuring (monitoring) the series resonance resistance value in order to set the series resonance resistance value to an adequate value. In other words, since the degree of vacuum and the series resonance resistance value are in inverse proportion as described above, and the degree of vacuum depends on a gettering amount, it is important to perform adequately without performing the gettering excessively or insufficiently in order to secure the adequate series resonance resistance value. For example, when the gettering adjustment is insufficient, the degree of vacuum in the interior of the cavity is kept at a reduced level. Therefore, the series resonance resistance value is increased. In contrast, when the degree of vacuum in the interior of the cavity is improved, the series resonance resistance value is lowered.

When the gettering adjustment is performed excessively, contaminant on a surface such as the substrate on which the getter material is mounted is gasificated and fills the interior of the cavity, a phenomenon which causes the unintentional lowering of the degree of vacuum in the same manner as the case of the insufficient gettering occurs. Therefore, it is desired to lower the series resonance resistance value as much as possible by setting the degree of vacuum at a high value by performing the gettering adjustment adequately while measuring the series resonance resistance value.

However, in a step of manufacturing the piezoelectric vibrator in the related art, measurement of the series resonance resistance value cannot be achieved unless the piezoelectric vibrators are manufactured individually by cutting the piezoelectric vibrator wafer member into small pieces.

In other words, although the electrode film formed on the bonded surface between the base substrate wafer and the lid substrate wafer is used as the bonding film to which the voltage is applied at the time of the anodic bonding, this electrode film is electrically bonded to all the piezoelectric vibrating strips stored in the plurality of cavities respectively. Therefore, the series resonance resistance values cannot be measured by causing the individual piezoelectric vibrating strips to vibrate separately unless the piezoelectric vibrator wafer member is cut. In this manner, adjustment of the degrees of vacuum in the interiors of the cavities while measuring the series resonance resistance values cannot be achieved in a stage of the piezoelectric vibrator wafer member. Consequently, the adequate series resonance resistance value cannot be secured.

Therefore, in the related art, a method of irradiating the getter material with the laser by a predetermined number of times depending on an empirical rule without measuring the series resonance resistance value is employed when performing the gettering adjustment before cutting the piezoelectric vibrator wafer member.

However, with this method, it is very difficult to set the degree of vacuum to an adequate value stably every time even though it depends on the empirical rule, and the adequate series resonance resistance value cannot be obtained. In particular, it induces the insufficient gettering or the excessive gettering in high probability. Among others, when the excessive gettering is performed on the getter material, it cannot be corrected, so that the piezoelectric vibrator by itself has to be discarded as being a nonconforming product.

In contrast, a method of performing the gettering adjustment after the individual piezoelectric vibrating strips are fabricated by cutting, not before cutting the piezoelectric vibrator wafer member, is employed as well.

According to this method, since the gettering adjustment can be performed while measuring the series resonance resistance value, the adequate series resonance resistance value is secured by adjusting the degree of vacuum. However, a number of piezoelectric vibrators cut into small pieces are needed to be set individually in the gettering adjusting machine. Therefore, there arise new problems such that a huge number of steps are required, and the manufacturing cost is increased.

Subsequently, the frequency adjustment in the related art still has the following problem.

In other words, the frequency of the piezoelectric vibrating strip cannot be measured unless the piezoelectric vibrators are manufactured individually by cutting the piezoelectric vibrator wafer member into small pieces. In other words, since the individual piezoelectric vibrating strips cannot be vibrated separately unless the piezoelectric vibrator wafer member is cut as described above, the frequency cannot be measured, and the frequency adjustment cannot be achieved while measuring the frequency in the state of the piezoelectric vibrator wafer member.

Therefore, in the related art, a method of performing the frequency adjustment after the individual piezoelectric vibrating strips are fabricated by cutting, not before cutting the piezoelectric vibrator wafer member, is employed.

According to this method, since the frequency adjustment is achieved while measuring the frequency, the frequency of the piezoelectric vibrating strip can be adjusted to a value within the range of the nominal frequency, so that the piezoelectric vibrator adjusted in frequency adequately is obtained. However, it is necessary to store a number of piezoelectric vibrators cut into small pieces individually into jigs and set the jigs in a frequency adjusting machine. Therefore, there arise problems such that a huge number of operating steps are required, and the manufacturing cost is increased. In addition, the jigs for storing the piezoelectric vibrators are varied in size due to an influence of a size tolerance. Therefore, machining accuracy at the time of the frequency adjustment is affected, so that there is a case where a component of the piezoelectric vibrator which should not be machined is erroneously machined. Accordingly, there is apprehension that the lowering of the quality of the piezoelectric vibrator may be resulted.

In view of such circumstances, it is a principal object of the present invention is to provide a piezoelectric vibrator manufacturing method which enables a gettering adjustment while measuring a series resonance resistance value before cutting a piezoelectric vibrator wafer member and manufacture of piezoelectric vibrators of a surface mount device type in which an adequate series resonance resistance value is secured by bringing the degrees of vacuum in the interiors of cavities near under vacuum as much as possible efficiently at low cost, a piezoelectric vibrator manufactured by this method, and an oscillator, an electronic apparatus, and a radio clock having this piezoelectric vibrator.

It is another object of the present invention is to provide a piezoelectric vibrator manufacturing method which enables manufacture of high-quality, high-performance piezoelectric vibrators in which an adequate frequency adjustment is achieved so as to vibrate within a range of a nominal frequency efficiently at low cost by performing the frequency adjustment while measuring the frequency before cutting a piezoelectric vibrator wafer member, a piezoelectric vibrator manufactured by this method, and an oscillator, an electronic apparatus, and a radio clock having this piezoelectric vibrator.

In order to solve the problems and achieve the objects as described above, the present invention provides following means.

(1) The present invention provides a piezoelectric vibrator manufacturing method for manufacturing a plurality of piezoelectric vibrators each including a piezoelectric vibrating strip having a pair of mount electrodes electrically connected to a pair of exciting electrodes encapsulated in a cavity formed between a base substrate and a lid substrate which are anodically bonding with each other at once, including: a cavity forming step for forming a plurality of depressions for the cavities on at least one of a base substrate wafer and a lid substrate wafer so as to define the cavities when the both wafers are superimposed; a bonding electrode film forming step for forming a bonding electrode film on a bonded surface of at least one of the both wafers; a mount pattern forming step for forming a plurality of pairs of mount patterns on the base substrate wafer so as to be accommodated respectively in the respective cavities when a plurality of the cavities are formed; a through hole forming step for forming a plurality of pairs of through holes on the base substrate wafer so as to allow the interiors of the respective cavities and the outside to brought into communication with each other when the plurality of cavities are formed; a through electrode forming step for forming a plurality of pairs of through electrodes by closing the pairs of through holes by a conductive material and patterning part of the conductive material on the base substrate wafer so as to be electrically connected to the pairs of mount patterns in a state of being accommodated in the respective cavities when the plurality of cavities are formed; a mount step for mounting a plurality of the piezoelectric vibrating strips so as to superimpose the pairs of mount electrodes on the pairs of mount patterns after having terminated the respective steps described above; a superimposing step for superimposing the both wafers to store the piezoelectric vibrating strips in the cavities and forming getter materials which absorb oxygen when being heated so as to be accommodated in the cavities after the mount step; a bonding step for anodically bonding the both wafers using the bonding electrode film and fabricating a piezoelectric vibrator wafer member after the superimposing step; a gettering step for adjusting the degrees of vacuum in the interiors of the cavities by heating the getter materials while vibrating the piezoelectric vibrating strips encapsulated in the cavities using the pairs of through electrodes and measuring series resonance resistance values after the bonding step; and a cutting step for cutting the piezoelectric vibrator wafer member into a plurality of small pieces of the piezoelectric vibrators after having terminated the adjustment of the degrees of vacuum in all of the interiors of the cavities.

According to the above-described manufacturing method, first of all, the cavity forming step for forming the plurality of depressions for the cavities on at least one of the base substrate wafer and the lid substrate wafer so as to define the cavities when the both wafers are superimposed is performed. Also, the bonding electrode film forming step for forming the bonding electrode film on the bonded surface of at least one of the base substrate wafer and the lid substrate wafer is performed. In other words, the bonding electrode film is provided in a state of surrounding the peripheries of the cavities after having bonded the both wafers.

Also, the mount pattern forming step for forming the plurality of pairs of mount patterns on the base substrate wafer is performed. At this time, the pair of mount patterns are formed so as to be accommodated in the each cavity when the plurality of the cavities are formed by superimposing the both wafers in the following step. In other words, since the pairs of mount patterns are not formed on the bonded surface of the base substrate wafer, they are electrically disconnected from the bonding electrode film.

Also, the through hole forming step for forming the plurality of pairs of through holes on the base substrate wafer is performed. At this time, the pairs of through holes are formed in such a manner that when the plurality of cavities are formed by superimposing the both wafers in the following step, the interiors of the respective cavities are communicated with the outside. In other words, the pairs of through holes are not formed on the bonded surface of the base substrate wafer.

Subsequently, the through electrode forming step for forming the plurality of pairs of through electrodes on the base substrate wafer is performed. The pair of through electrodes are formed in the each cavity so as to be electrically connected to the pair of mount patterns in the each cavity respectively when the plurality of cavities are formed by superimposing the both wafers in the following step. Specifically, it is formed by closing the pair of through holes by the conductive material and patterning the part of the conductive material on the base substrate wafer in the respective cavities. Since the pairs of through electrodes are not formed on the bonded surface of the base substrate wafer, they are electrically disconnected from the bonding electrode film. Accordingly, conduction with the pairs of mount patterns via the pairs of through electrodes is achieved without being affected by the bonding electrode film.

Subsequently, after having terminated all of the respective steps described above, the mount step for mounting the plurality of piezoelectric vibrating strips is performed. Specifically, the piezoelectric vibrating strips are mounted so that the pairs of mount electrodes are superimposed on the plurality of pairs of mount patterns formed on the base substrate wafer. Accordingly, the piezoelectric vibrating strips are supported in a state in which the pairs of mount patterns and the pairs of mount electrodes are electrically connected.

Then, after having terminated the mount step, the superimposing step for superimposing the both wafers and storing the piezoelectric vibrating strips in the plurality of cavities respectively is performed. At this time, the getter materials which absorb oxygen when being heated are formed so as to be accommodated within the respective cavities. Accordingly, the getter materials are encapsulated in the respective cavities after having bonded the both wafers.

Subsequently, the bonding step for anodically bonging the superimposed both wafers is performed using the bonding electrode film. Accordingly, the piezoelectric vibrator wafer member having the piezoelectric vibrating strips encapsulated in the plurality of cavities formed between the both wafers is fabricated.

Then, after having fabricated the piezoelectric vibrator wafer member, the gettering step for adjusting the degrees of vacuum in the interiors of the cavities is performed by heating the getter materials encapsulated in the respective cavities. The cutting step for cutting the piezoelectric vibrator wafer member into the small pieces of piezoelectric vibrators is performed after having terminated the adjustment of the degrees of vacuum in all of the interiors of the cavities.

Consequently, a plurality of surface mounted type piezoelectric vibrators each including the piezoelectric vibrating strip having the pair of mount electrodes electrically connected to the pair of exciting electrodes encapsulated in the cavity formed between the base substrate and the lid substrate which are anodically bonding with each other are manufactured at once.

Specifically, when adjusting the degrees of vacuum in the interior of the cavity in the gettering step, the pair of through electrodes are used to vibrate the piezoelectric vibrating strip encapsulated in the cavity, and the getter materials are heated while measuring the series resonance resistance value of the piezoelectric vibrating strip. In other words, the piezoelectric vibrating strip can be rendered conductive to the outside via the pair of mount electrodes, the pair of mount patterns and the pair of through electrodes. Therefore, by applying the predetermined voltage to the pair of through holes, the voltage can be applied to the pair of exciting electrodes, and hence the piezoelectric vibrating strip can be vibrated.

In addition, the pair of through electrodes and the pair of mount patterns are provided respectively in all the cavities of the piezoelectric vibrator wafer member, and are electrically disconnected from the bonding electrode film. Therefore, the individual piezoelectric vibrating strips can be vibrated separately. Therefore, the degrees of vacuum in the interiors of the cavities can be adjusted individually while measuring the series resonance resistance values of the individual piezoelectric vibrators before cutting the piezoelectric vibrator wafer member. Therefore, the gettering adjustment can be performed without performing the gettering excessively or insufficiently, and the degrees of vacuum in the interiors of the cavities can be brought near under the vacuum as much as possible. Therefore, the adequate series resonance resistance value can be secured. Consequently, the piezoelectric vibrators with improved quality and improved performance are fabricated.

The term "series resonance resistance value" of the piezoelectric vibrator means the series resonance resistance value of the piezoelectric vibrating strip encapsulated in the cavity of the corresponding piezoelectric vibrator.

Also, since the adequate series resonance resistance value can be secured by performing the gettering adjustment before performing the cutting step, it is not necessary to set an infinite number of piezoelectric vibrators cut into small pieces in the gettering adjusting device individually. Therefore, the cost reduction and improvement of the operation efficiency in the manufacture of the piezoelectric vibrators. Also, since the excessive gettering can be prevented, the frequency of generation of nonconforming products which cannot be repaired can significantly be reduced.

(2) The getter materials may be stored so as to be formed on any one of the base substrate wafer and the lid substrate wafer in the superimposing step.

In this case, since the getter materials are formed on any one of the base substrate wafer and the lid substrate wafer, an effect of heating on the piezoelectric vibrating strips can be minimized when heating the getter materials by the gettering step. Therefore, further improvement in quality and improvement in performance are achieved.

(3) The getter materials may be heated by a laser beam from the side of the wafer on which the getter materials are formed in the gettering step.

In this case, the gettering adjustment is performed by heating the getter materials using the laser beam. In addition, the laser beam is emitted from the side of the wafer where the getter materials are formed.

Here, an optical flux generally refracts on an interface of a substance having a different index of refraction if such substance exists on its optical path. Therefore, in order to cause the optical flux to enter an intended point, the refraction is needed to be taken into consideration. Therefore, if the number of times of refraction is large, it is difficult to cause the optical flux to enter the intended point.

However, in this case, since the laser beam is emitted from the side of the wafer where the getter materials are formed in this embodiment as described above, the refraction of the laser beam for heating the getter materials may be limited to the time only when entering the wafer. Accordingly, an effect of the refraction can be minimized, and the laser beam can be irradiated to the intended points of the getter materials with high degree of accuracy. Therefore, the gettering adjustment can be performed more accurately.

(4) The plurality of series resonance resistance values of the piezoelectric vibrating strips encapsulated in the cavities may be measured simultaneously in the gettering step.

In this case, A plurality of the series resonance resistance values of the piezoelectric vibrating strips encapsulated in the cavities are measured simultaneously in the gettering step. Accordingly, in the gettering step, the time period consumed for measuring the series resonance resistance values is reduced, and the efficiency of the manufacture of the piezoelectric vibrators can further be improved.

(5) A frequency adjusting step for adjusting the frequency while vibrating the piezoelectric vibrating strip encapsulated in the cavity using the pair of through electrodes and measuring the frequency of the piezoelectric vibrating strip after the bonding step and before the cutting step may be provided.

In this case, the frequency adjusting step for adjusting the frequency of the piezoelectric vibrating strip encapsulated in the cavity after the bonding step and before the cutting step may be provided.

In particular, by the frequency adjustment step, the piezoelectric vibrating strips encapsulated in the cavities are vibrated using the pairs of through holes and the frequency adjustment is performed while measuring the frequencies of the piezoelectric vibrating strips when adjusting the frequencies of the piezoelectric vibrating strips. Here, even in the state of the piezoelectric vibrator wafer member, the individual piezoelectric vibrating strips can be vibrated separately via the pairs of through holes and the pairs of mount patterns as described above. Therefore, the frequency adjustment can be performed individually while measuring the frequencies of the individual piezoelectric vibrators before cutting the piezoelectric vibrator wafer member. Accordingly, the frequencies of the piezoelectric vibrators can be adjusted adequately, and vibration in the range of the nominal frequency is achieved, so that improvement of the quality and improvement of the performance of the piezoelectric vibrators are achieved.

Also, since the frequencies of the piezoelectric vibrators can be caused to fall within the nominal frequency by performing the frequency adjustment before performing the cutting step, a complicated work to store the infinite number of piezoelectric vibrators cut into small pieces individually in the jigs and set the jigs into the frequency adjusting device is not necessary. Therefore, the cost reduction and improvement of the operation efficiency in the manufacture of the piezoelectric vibrators.

Furthermore, since the necessity of storage of the individual piezoelectric vibrators in the jigs and the frequency adjustment is eliminated, influence on the processing accuracy at the time of the frequency adjustment caused by variations of the dimensions of the jigs is eliminated. Therefore, the possibility of erroneous processing of the components of the piezoelectric vibrators in the frequency adjustment is dramatically reduced, so that the higher quality of the piezoelectric vibrators is achieved.

The term "frequency" of the piezoelectric vibrator means the frequency of the piezoelectric vibrating strip encapsulated in the cavity of the corresponding piezoelectric vibrator.

(6) The frequencies of the plurality of the piezoelectric vibrating strips encapsulated in the cavities may be measured simultaneously in the frequency adjusting step.

In this case, the frequencies of the plurality of the piezoelectric vibrating strips encapsulated in the cavities are measured simultaneously in the frequency adjusting step. Accordingly, the time period consumed for measuring the frequencies is reduced in the frequency adjusting step, and the efficiency of the manufacture of the piezoelectric vibrators can further be improved.

(7) The gettering step may be performed prior to the frequency adjusting step.

Also, since the gettering step is performed prior to the frequency adjustment step, the degrees of vacuum in the interiors of the cavities which cause an influence on the frequencies of the piezoelectric vibrating strips in the cavities are adjusted in advance at the time of the frequency adjustment step. Therefore, the frequencies of the piezoelectric vibrating strips adjusted in the frequency adjustment step are not affected by the gettering step, so that the piezoelectric vibrators adjusted to an adequate frequency can be manufactured with the adequate series resonance resistance values secured.

(8) The piezoelectric vibrator according to the present invention is a piezoelectric vibrator including a piezoelectric vibrating strip having a pair of mount electrodes electrically connected to a pair of exciting electrodes encapsulated in a cavity formed between a base substrate and a lid substrate which are anodically bonding with each other, including: a pair of mount pattern formed on the base substrate in the cavity, electrically connected to the pair of mount electrodes respectively, and configured to support the piezoelectric vibrating strip; a bonding electrode film formed on a bonded surface of at least one of the base substrate and the lid substrate in a state of surrounding the periphery of the cavity; a pair of through holes formed on the base substrate so that the interior of the cavity and the outside come into communication; a pair of through electrodes provided so as to close the pair of through holes respectively and patterned on the base substrate in the cavity so as to be electrically connected to the pair of mount patterns respectively; and a getter material encapsulated in the cavity and configured to absorb oxygen in the cavity by being heated.

In this case, the same effects and advantages as the piezoelectric vibrator manufacturing method described in (1) described above are achieved.

(9) The getter material may be formed on any one of the base substrate and the lid substrate.

In this case, the same effects and advantages as the piezoelectric vibrator manufacturing method described in (2) described above are achieved.

(10) An oscillator according to the present invention includes the piezoelectric vibrator according to (8) or (9) described above electrically connected to an integrated circuit as an oscillating element.

(11) An electronic apparatus according to the present invention includes the piezoelectric vibrator according to (8) or (9) described above electrically connected to a timer unit.

(12) A radio clock according to the present invention includes the piezoelectric vibrator according to the present invention electrically connected to a filtering unit.

According to the oscillator, the radio clock, and the electronic apparatus, since the piezoelectric vibrator improved in the quality, improved in the performance, reduced in the cost, and improved in the efficiency is provided, improvement in quality, improvement in performance, reduction in cost, and improvement in efficiency are achieved correspondingly.

According to the piezoelectric vibrator in the present invention, since the degrees of vacuum in the interiors of the cavities are extremely near under the vacuum and the adequate series resonance resistance values are secured, improvement in quality and improvement in performance can be achieved. Also, by adjusting the frequencies adequately so that the individual piezoelectric vibrating strips vibrate within the range of the nominal frequency, further improvement in quality and improvement in performance are achieved.

According to the piezoelectric vibrator manufacturing method in the present invention, since the gettering adjustment is performed while measuring the series resonance resistance values before cutting the piezoelectric vibrator wafer member, the piezoelectric vibrators described above can be manufactured at low cost with high efficiency. Furthermore, by adjusting the frequencies while measuring the frequencies before cutting the piezoelectric vibrator wafer member, the piezoelectric vibrators described above can be manufactured at a further lower cost with high efficiency.

Also, according to the oscillator, the electronic apparatus, and the radio clock in the present invention, since the piezoelectric vibrators described above are provided, improvement in quality and improvement in performance reduction in cost, and improvement in efficiency are achieved correspondingly.

BRIEF DESCRIPTION OF THE DRAWINGS

FIG. 3 is a cross-sectional view taken along an arrow A-A in FIG. 2.

FIG. 4 is a cross-sectional view taken along an arrow B-B in FIG. 2.

DETAILED DESCRIPTION OF THE PREFERRED EMBODIMENTS

First Embodiment

Figure 1:
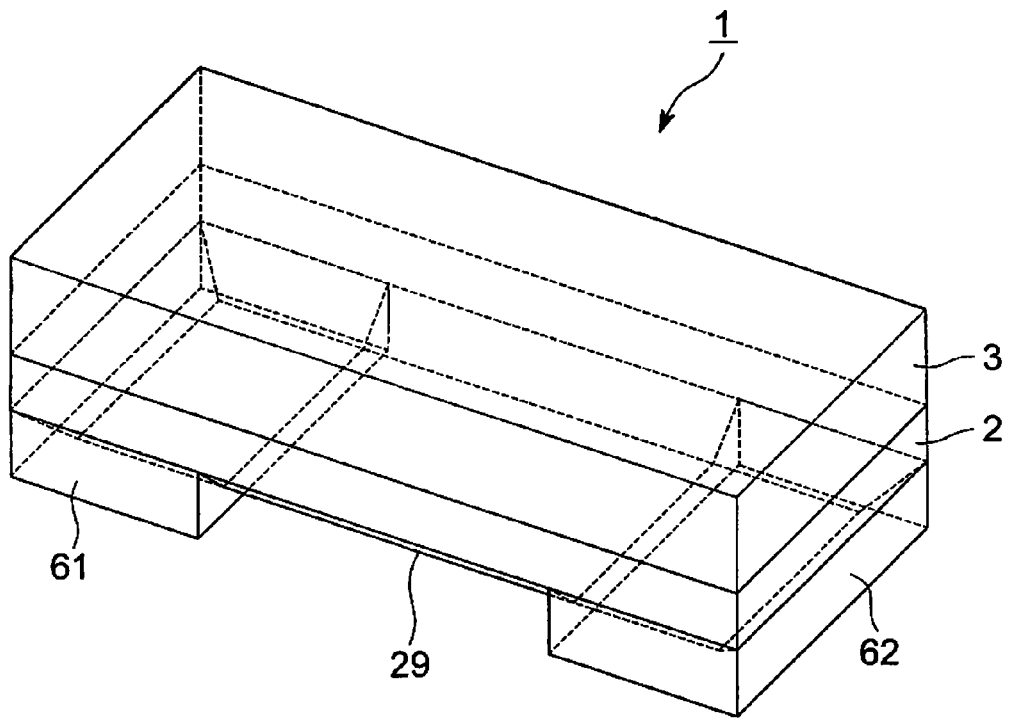
FIG. 1 is a general perspective view of a piezoelectric vibrator manufactured by a piezoelectric vibrator manufacturing method according to a first embodiment of the present invention.

Referring now to FIG. 1 to FIG. 22, a piezoelectric vibrator manufacturing method and a piezoelectric vibrator manufactured by this manufacturing method according to a first embodiment of the present invention.

A piezoelectric vibrator 1 manufactured by the manufacturing method according to this embodiment is the piezoelectric vibrator 1 of a surface mount device type (two-layer structure type) including a piezoelectric vibrating strip 4 having a pair of mount electrodes 46, 47 electrically connected to a pair of exciting electrodes 45 encapsulated in a cavity C defined between a base substrate 2 and a lid substrate 3 which are anodically bonded with each other as shown in FIG. 1 to FIG. 5.

The piezoelectric vibrator 1 includes: a pair of mount patterns 21 formed on the base substrate 2 in the cavity C, electrically connected to the pair of mount electrodes 46, 47 respectively and supporting the piezoelectric vibrating strip 4; a bonding electrode film 32 formed on a bonded surface of the lid substrate 3 in a state of surrounding the periphery of the cavity C; a pair of through holes 22 formed on the base substrate 2 so as to communicate the interior of the cavity C with the outside; a pair of through electrodes 23 provided so as to close the pair of through holes 22 respectively and patterned on the base substrate 2 in the cavity C so as to be electrically connected respectively to the pair of mount patterns 21; and getter materials 26 encapsulated in the interior of the cavity C and configured to absorb oxygen in the cavity C by being heated.

Figure 5:
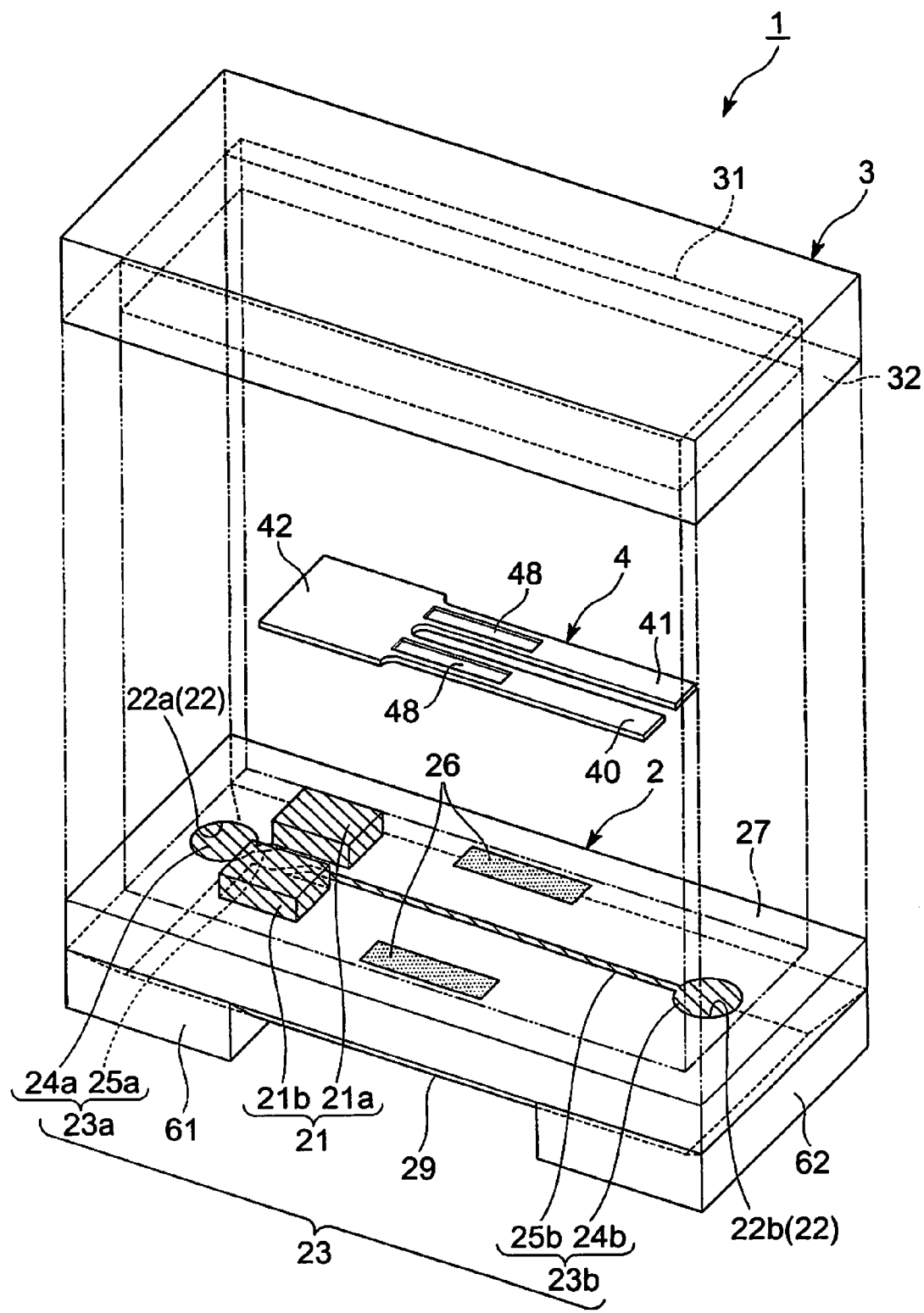
FIG. 5 is an exploded perspective view of the piezoelectric vibrator shown in FIG. 1.

In FIG. 5, for the sake of easy understanding of the drawing, illustration of the pair of exciting electrodes 45, the pair of mount electrodes 46, 47, and leading electrodes 49, 50 and a weight metal film 51 described later is omitted.

Figure 6:
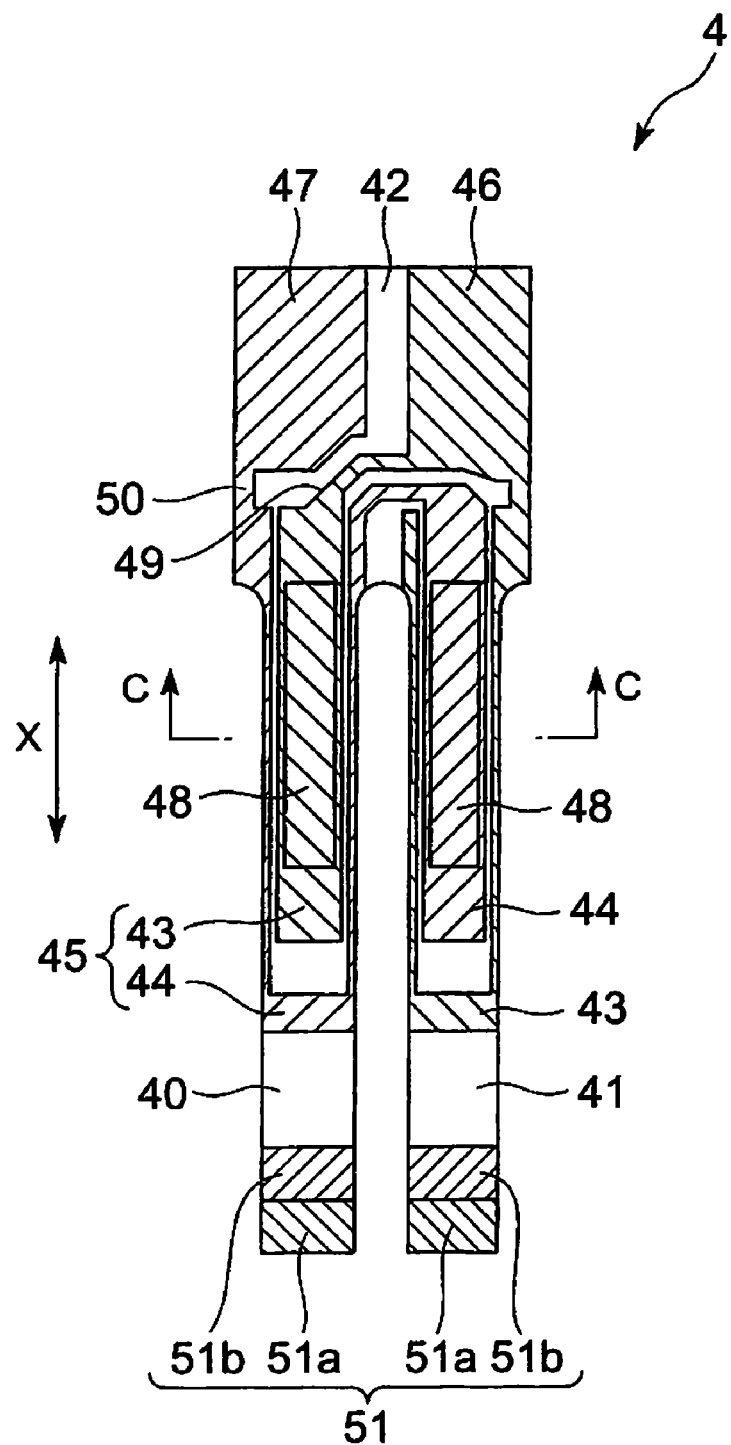
FIG. 6 is a top plan view of a piezoelectric vibrating strip used in the piezoelectric vibrator shown in FIG. 1.
Figure 7:
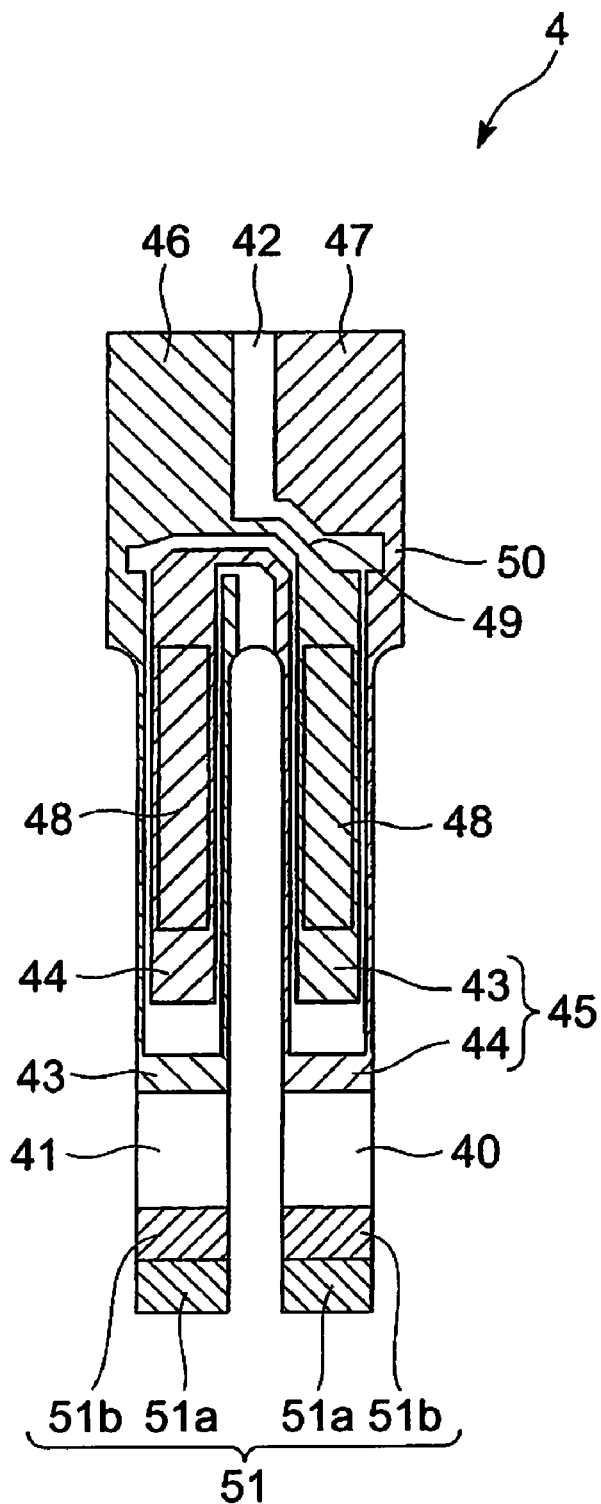
FIG. 7 is a bottom view of the piezoelectric vibrating strip used in the piezoelectric vibrator shown in FIG. 1.

The piezoelectric vibrating strip 4 is a vibrating strip having a tuning fork formed of piezoelectric material such as crystal, lithium tantalite, or lithium niobate, as shown in FIG. 6 and FIG. 7, and is configured to vibrate when a predetermined voltage is applied thereto.

The piezoelectric vibrating strip 4 includes: a pair of vibrating arm portions 40, 41 arranged in parallel; a base portion 42 configured to integrally fix proximal end sides of the pair of vibrating arm portions 40, 41; the pair of exciting electrodes 45 including first exciting electrodes 43 and second exciting electrodes 44 formed on outer surfaces of the pair of vibrating arm portions 40, 41 for vibrating the pair of vibrating arm portions 40, 41; and the pair of mount electrodes 46, 47 electrically connected respectively to the pair of exciting electrodes 45.

The piezoelectric vibrating strip 4 in this embodiment also includes groove portions 48 formed respectively on both main surfaces of the pair of vibrating arm portions 40, 41 along a longitudinal direction X of the vibrating arm portions 40, 41. The groove portions 48 are formed from the proximal end sides of the vibrating arm portions 40, 41 to substantially midsections thereof.

Figure 8:
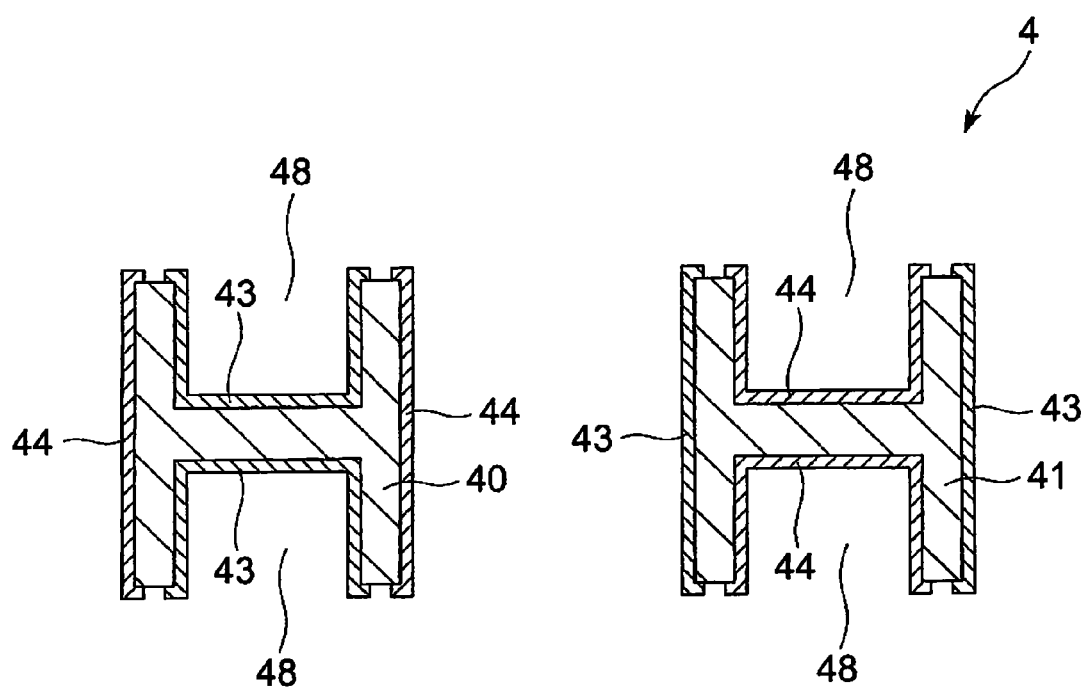
FIG. 8 is a cross-sectional view taken along an arrow C-C in FIG. 6.

The pair of exciting electrodes 45 including first exciting electrodes 43 and second exciting electrodes 44 are electrodes which cause the pair of vibrating arm portions 40, 41 to vibrate in the direction toward and apart from each other at a predetermined resonance frequency and are formed by patterning on the outer surfaces of the pair of vibrating arm portions 40, 41 in a state of being electrically disconnected. More specifically, as shown in FIG. 8, the first exciting electrodes 43 are mainly formed on the groove portions 48 of the one vibrating arm portion 40 and on both side surfaces of the other vibrating arm portion 41, and the second exciting electrodes 44 are mainly formed on both side surfaces of the vibrating arm 40 and on the groove portions 48 of the other vibrating arm portion 41.

The first exciting electrodes 43 and the second exciting electrodes 44 are electrically connected to the pair of mount electrodes 46, 47 via the leading electrodes 49, 50 respectively on both main surfaces of the base portion 42 as shown in FIG. 6 and FIG. 7. Then, the piezoelectric vibrating strip 4 is configured to be applied with a voltage via the pair of mount electrodes 46, 47.

The pair of exciting electrodes 45, the pair of mount electrodes 46, 47 and the leading electrodes 49, 50 described above are formed of films such as conductive films formed of chrome (Cr), nickel (Ni), Aluminum (Al), Titan (Ti), or the like.

Distal ends of the pair of vibrating arm portions 40, 41 are each coated with the weight metal film 51 for adjusting (frequency adjustment) vibrating states of themselves to vibrate within a range of a predetermined frequency. The weight metal film 51 is divided into a coarse adjustment film 51a used when adjusting the frequency coarsely and a fine adjustment film 51b for adjusting the same finely. By performing the frequency adjustment using the coarse adjustment film 51a and the fine adjustment film 51b, the frequencies of the pair of vibrating arm portions 40, 41 can be adjusted to fall within a range of a nominal frequency of a device.

Figure 2:
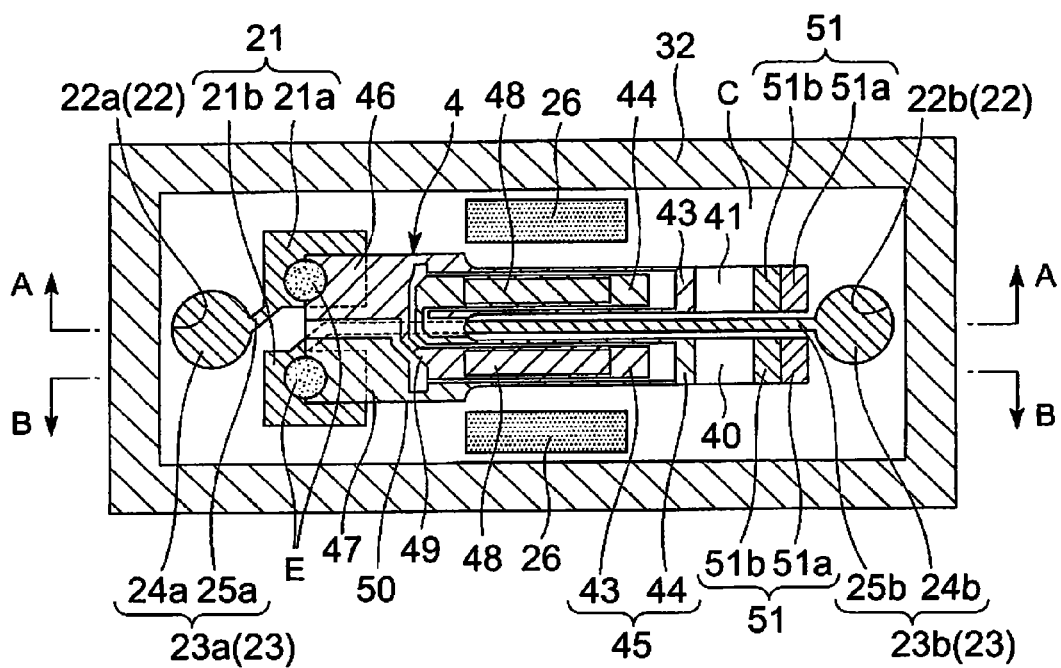
FIG. 2 is a drawing showing an interior of the piezoelectric vibrator shown in FIG. 1 with a lid substrate removed in a state of being viewed from above.

The piezoelectric vibrating strip 4 configured in this manner is mounted via a conductive adhesive agent E in a state in which the base portion 42 is placed on the pair of mount patterns 21 of the base substrate 2 as shown in FIG. 2 to FIG. 4. In this case, the piezoelectric vibrating strip 4 is in a state of being stored in the cavity C defined by a depression 31 of the lid substrate 3, described later, and the base substrate 2. A mounting method of the piezoelectric vibrating strip 4 is not limited to the one using the conductive adhesive agent E, and may employ a bump connection of gold or the like.

The base substrate 2 is formed of soda lime glass, and is formed into a panel shape as shown in FIG. 1 to FIG. 5. Then, the pair of mount patterns 21, the pair of through holes 22, the pair of through electrodes 23, and the getter materials 26 are formed on the side of a bonded surface 27 on which the lid substrate 3 is bonded.

The pair of mount patterns 21 include a first mount pattern 21a and a second mount pattern 21b formed respectively of conductive material as shown in FIG. 2 to FIG. 5. The first mount pattern 21a and the second mount pattern 21b are electrically disconnected from each other, and are electrically disconnected from the bonding electrode film 32 of the lid substrate 3. Then, the first mount pattern 21a is electrically connected to the one mount electrode 46 of the piezoelectric vibrating strip 4, and the second mount pattern 21b is electrically connected to the other mount electrode 47 of the piezoelectric vibrating strip 4.

The pair of through holes 22 include a first through hole 22a and a second through hole 22b provided along the direction of the thickness of the base substrate 2 as shown in FIG. 2, FIG. 3, and FIG. 5. The first through hole 22a and the second through hole 22b are formed at positions which do not come into contact with the bonding electrode film 32 of the lid substrate 3.

The pair of through electrodes 23 include a first through electrode 23a and a second through electrode 23b. Furthermore, the first through electrode 23a includes a first through hole electrode 24a formed so as to close the first through hole 22a with the conductive material, and a first leading electrode film 25a as a conductive film provided so as to electrically connect the first through hole electrode 24a to the first mount pattern 21a. In the same manner, the second through electrode 23b includes a second through hole electrode 24b formed so as to close the second through hole 22b with the conductive material, and a second leading electrode film 25b as a conductive film provided so as to electrically connect the second through hole electrode 24b to the second mount pattern 21b. The first through electrode 23a and the second through electrode 23b are both formed so as to be electrically disconnected from the bonding electrode film 32 of the lid substrate 3.

In other words, the first through electrode 23a is electrically connected to the first exciting electrodes 43 of the piezoelectric vibrating strip 4 via the first mount pattern 21a and the one mount electrode 46 of the piezoelectric vibrating strip 4. In the same manner, the second through electrode 23b is electrically connected to the second exciting electrodes 44 of the piezoelectric vibrating strip 4 via the second mount pattern 21b and the other mount electrode 47 of the piezoelectric vibrating strip 4. Therefore, by applying a predetermined voltage using the pair of through electrodes 23, the pair of vibrating arm portions 40, 41 are vibrated at a predetermined frequency in the direction toward and apart from each other. Furthermore, the pair of through electrodes 23 are not affected by the bonding electrode film 32 of the lid substrate 3.

The getter materials 26 are formed at positions which are not overlapped with the piezoelectric vibrating strip 4 when viewing the base substrate 2 from above as shown in FIG. 2 and FIG. 5. The getter materials 26 are formed, for example, of an aluminum film. The getter materials 26 are in a state of being heated by an adequate amount so as to bring the interior of the cavity C into an adequate degree of vacuum in a gettering step S51 in the manufacturing method in this embodiment described later. Although the getter materials 26 are provided at two positions on the base substrate 2 in this embodiment, the number of positions to be provided is not limited, and may be one or three or more.

Also, as shown in FIG. 1, a bottom surface of the base substrate 2 is formed with a notched portion 29 so as to chamfer a corner. Then, conductive films are formed from the side of a short side of the notched portion 29 over part of the bottom surface of the base substrate 2, and constitute a first external electrode 61 and a second external electrode 62. As shown in FIG. 3, the first external electrode 61 is electrically connected to the first through electrode 23a and the second external electrode 62 is electrically connected to the second through electrode 23b. In other words, the first external electrode 61 is electrically connected to the one mount electrode 46 of the piezoelectric vibrating strip 4 via the first through electrode 23a and the first mount pattern 21a. In the same manner, the second external electrode 62 is electrically connected to the other mount electrode 47 of the piezoelectric vibrating strip 4 via the second through electrode 23b and the second mount pattern 21b.

The lid substrate 3 is formed of soda lime glass like the base substrate 2 and formed into a panel shape having a size which can be superimposed with the base substrate 2 as shown in FIG. 1 to FIG. 5. The depression 31 for the cavity C and the bonding electrode film 32 are formed on the side of the bonded surface where the base substrate 2 is bonded.

The depression 31 is provided so as to constitute part of the cavity C which is able to encapsulate the piezoelectric vibrating strip 4 mounted on the pair of mount patterns 21 of the base substrate 2, described above. The interior of the cavity C defined by the depression 31 is adjusted to a degree of vacuum which achieves an adequate series resonance resistance value in the gettering step S51 in the manufacturing method in this embodiment, described later.

The bonding electrode film 32 is formed of a conductive film on the bonded surface of the lid substrate 3 so as to surround the periphery of the depression 31. In other words, by applying the voltage using this bonding electrode film 32, anodic bonding between the base substrate 2 and the lid substrate 3 is enabled.

When activating the piezoelectric vibrator 1 configured in this manner, a predetermined drive voltage is applied to the first external electrode 61 and the second external electrode 62 formed on the base substrate 2. Accordingly, the drive voltage can be applied to the pair of exciting electrodes 45 including the first exciting electrodes 43 and the second exciting electrodes 44 via the pair of through electrodes 23, the pair of mount patterns 21, the pair of mount electrodes 46, 47, and the leading electrodes 49, 50, so that the pair of vibrating arm portions 40, 41 can be vibrated at the predetermined frequency in the direction toward and apart from each other. Then, the vibration of the pair of vibrating arm portions 40, 41 can be used as a time instance source, a timing source for the control signals, a reference signal source, and so on.

Figure 9:
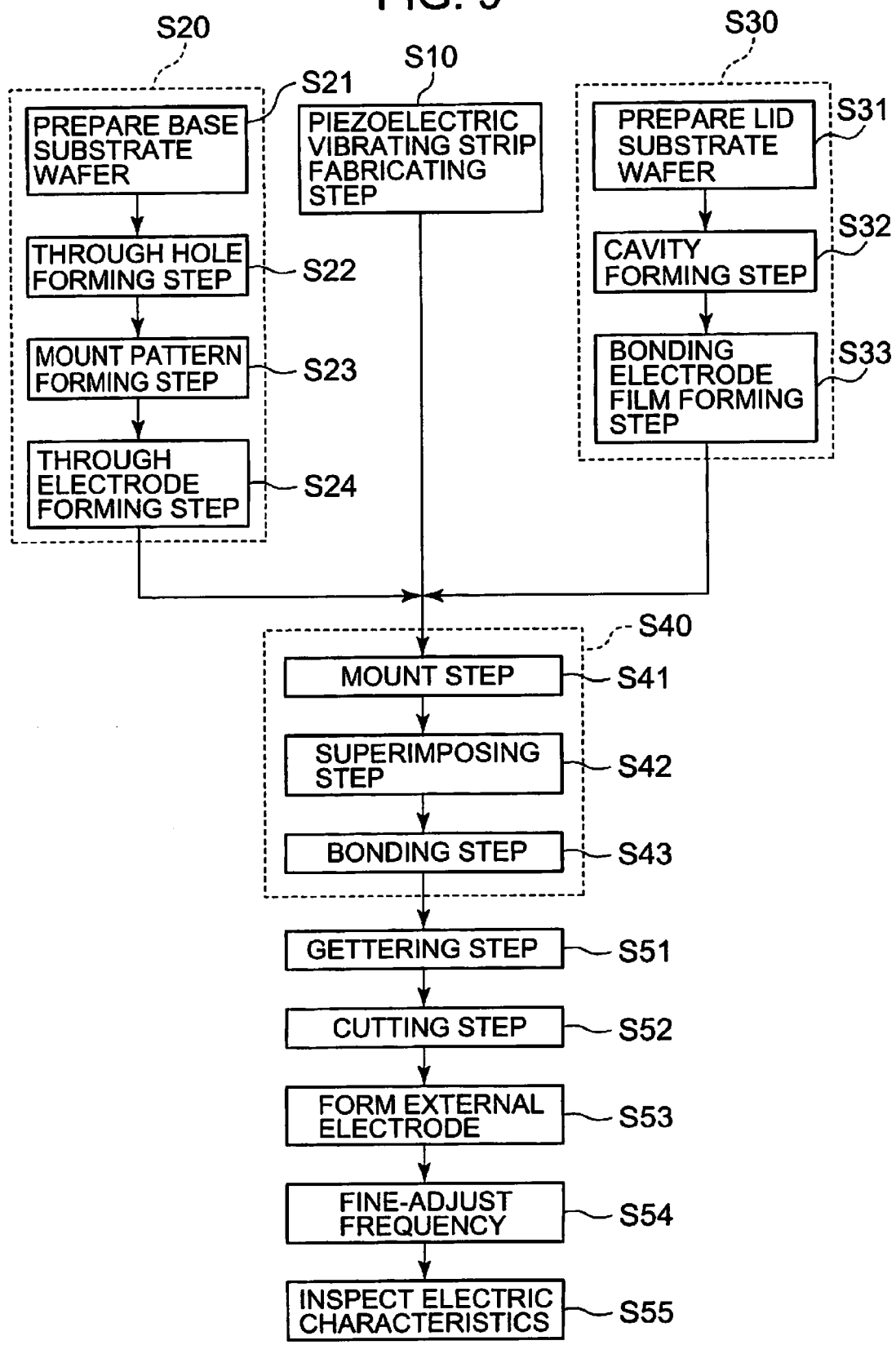
FIG. 9 is a flowchart of the piezoelectric vibrator manufacturing method according to the first embodiment of the present invention.

Subsequently, the manufacturing method for manufacturing the piezoelectric vibrator 1 described above will be described with reference with a flowchart shown in FIG. 9 using FIG. 10 to FIG. 22.

First of all, a piezoelectric vibrating strip fabricating step S10 is performed to fabricate the piezoelectric vibrating strip 4 shown in FIG. 6 to FIG. 8. More specifically, Lambert raw stone of crystal is sliced at a predetermined angle to obtain a wafer of a certain thickness. Subsequently, the wafer is wrapped and coarsely machined, then an affected layer is removed by etching, and then mirror grinding such as polishing is performed to obtain the wafer having a predetermined thickness. Subsequently, after having treated the wafer adequately such as washing, patterning of the outer shape of the piezoelectric vibrating strip 4 is performed on the wafer and then formation and patterning of the metallic film are performed thereon with photolithography technique, so that the pair of exciting electrodes 45, the leading electrodes 49, 50, the pair of mount electrodes 46, 47, and the weight metal film 51 are formed. Accordingly, a plurality of the piezoelectric vibrating strips 4 can be fabricated.

After having fabricated the piezoelectric vibrating strip 4, the coarse adjustment of the resonance frequency is performed. This is achieved by irradiating the coarse adjustment film 51a of the weight metal film 51 with a laser beam to cause part of them to evaporate and changing the weight. The fine adjustment for adjusting the resonance frequency with higher degree of accuracy is performed after having mounted. This will be described later.

Figure 10:
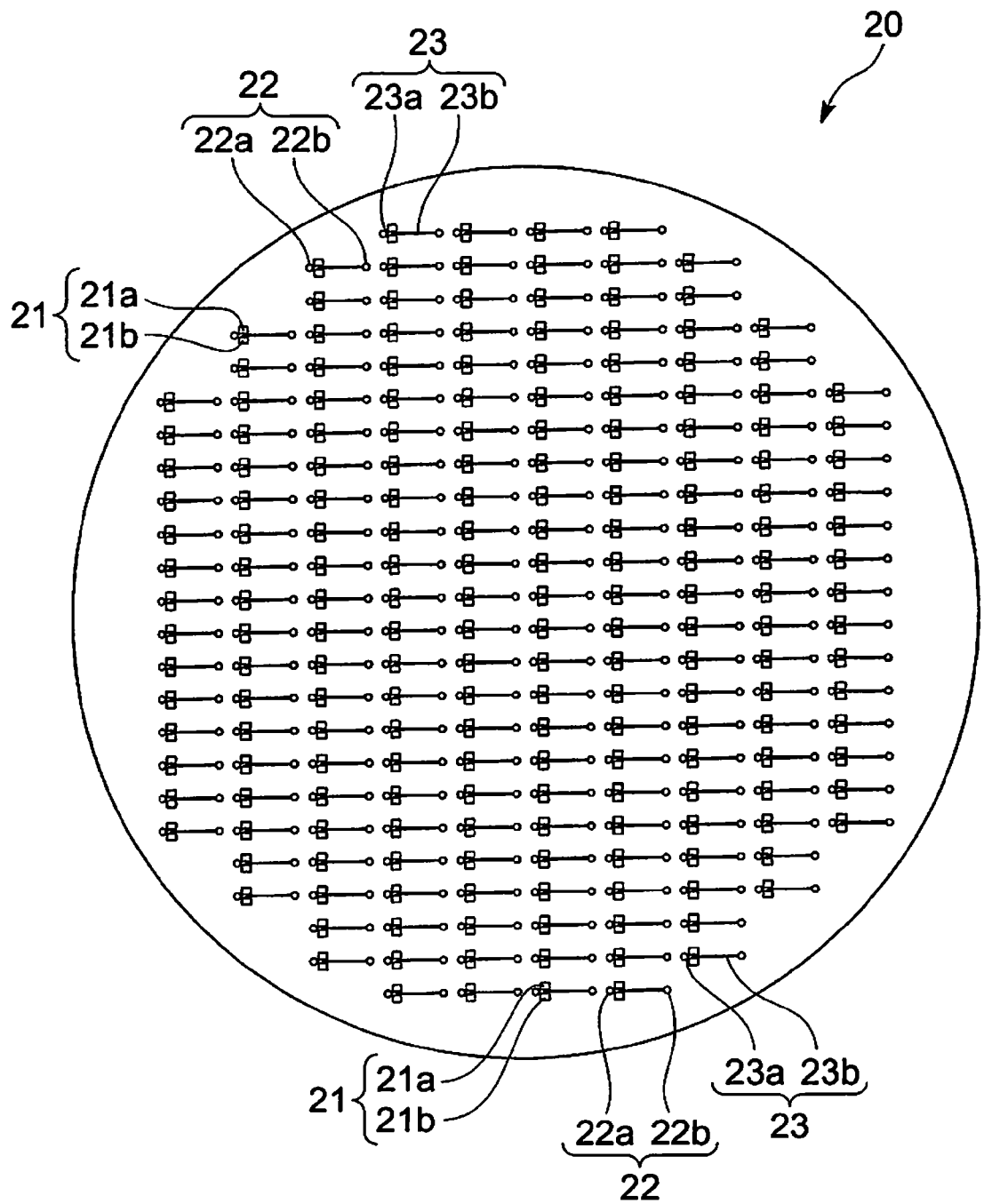
FIG. 10 is a process drawing of a case where the piezoelectric vibrator is manufactured along the flowchart shown in FIG. 9, and is a top view of a base substrate wafer which is formed into base substrates later.

Then, a base wafer fabricating step S20 for fabricating the base substrate wafer 20 which is formed into the base substrates 2 later to a state immediately before being subjected to a mount step S41 as shown in FIG. 10 is performed. In FIG. 11 to FIG. 15 used for description, the base substrate 2 is shown in a state of being cut into a small piece instead of being in a wafer state for easy understanding of the drawing. Actually, however, the base substrate wafer 20 in the wafer state is processed.

Figure 11:
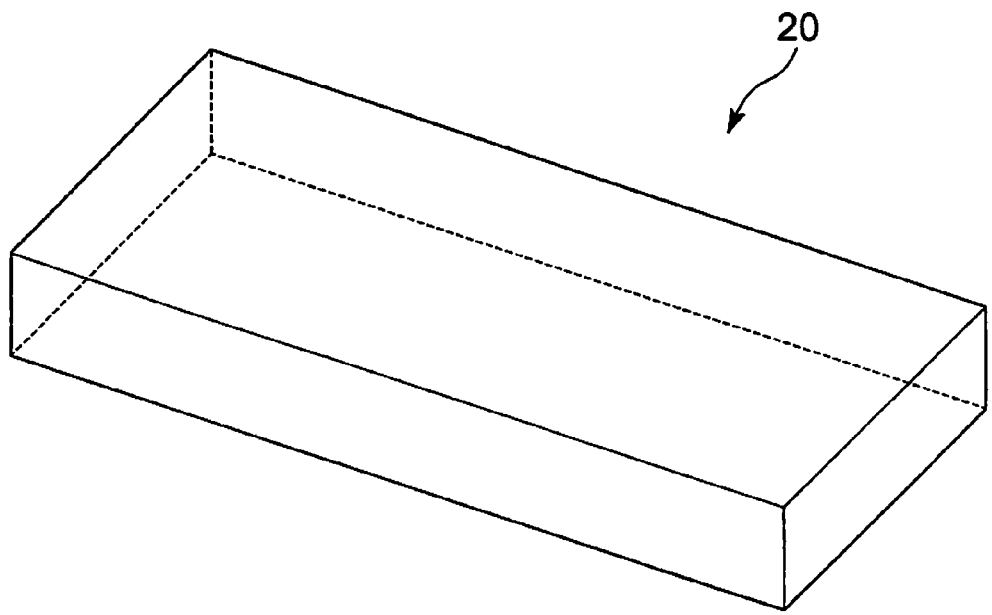
FIG. 11 is a process drawing of the case where the piezoelectric vibrator is manufactured along the flowchart shown in FIG. 9, and is a partial perspective view of the base substrate wafer which is formed into the base substrates later.
Figure 12:
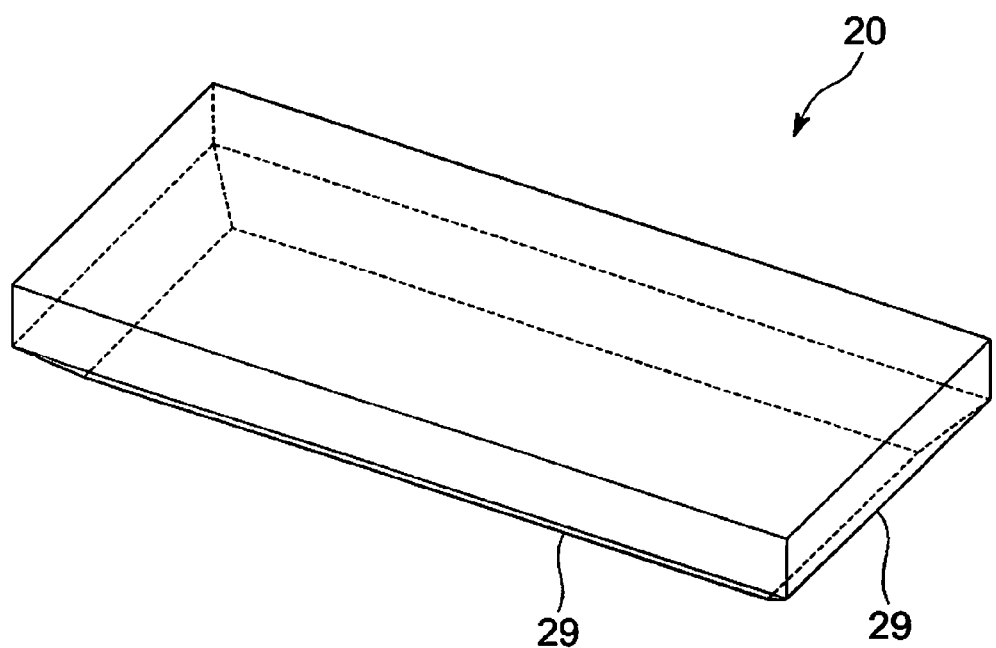
FIG. 12 is a process drawing of the case where the piezoelectric vibrator is manufactured along the flowchart shown in FIG. 9, and is a partial perspective view of the base substrate wafer which is formed into the base substrates later.

First of all, after having grinded the soda lime glass to a predetermined thickness and washed the same, as shown in FIG. 11, the base substrate wafer 20 of a disc shape having an affected layer on a top surface thereof removed by etching or the like is formed. Subsequently, a plurality of the notched portions 29 are formed on a bottom surface of the base substrate wafer 20 by etching or the like (S21). Accordingly, as shown in FIG. 12, when the base substrate wafer 20 is cut into the individual piezoelectric vibrators 1, a state in which the corners of the bottom surface are chamfered is achieved.

Figure 13:
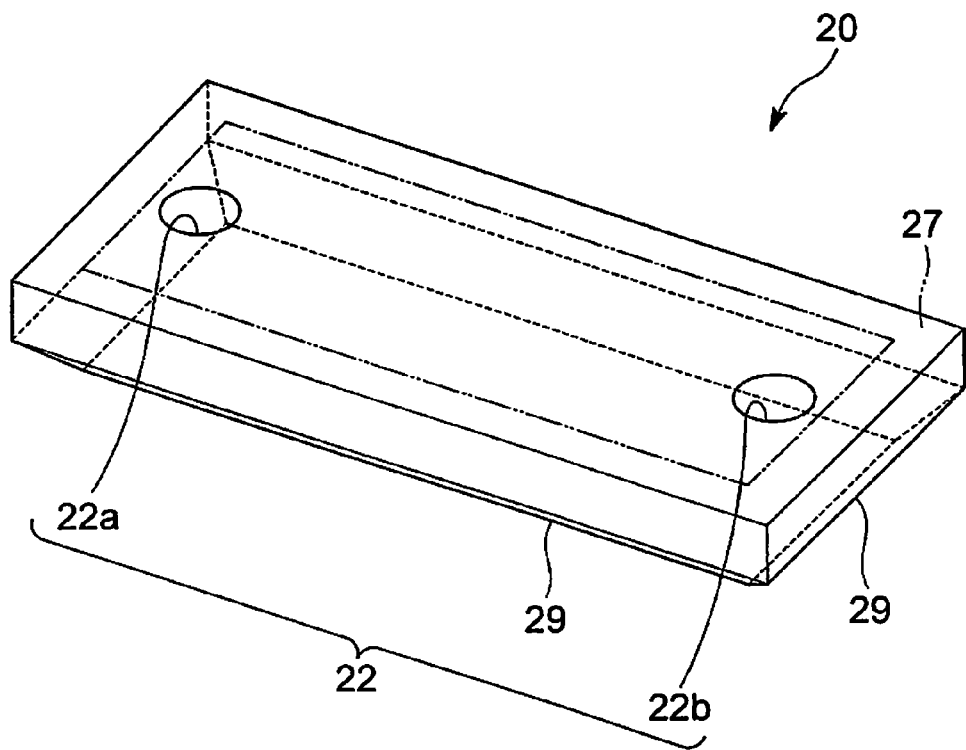
FIG. 13 is a process drawing of the case where the piezoelectric vibrator is manufactured along the flowchart shown in FIG. 9, and is a partial perspective view of the base substrate wafer which is formed into the base substrates later.

Subsequently, a through hole forming step S22 for forming a plurality of pairs of the through holes 22 on the base substrate wafer 20 in row and column directions by blasting or the like is performed. At this time, the pair of through holes 22 are formed in such a manner that the interior of the each cavity C communicates with the outside as shown in FIG. 13 when a plurality of the cavities C are defined by superimposing the both wafers 20, 30. In other words, the pair of through holes 22 are not formed on the bonded surface 27 of the base substrate wafer 20.

Figure 14:
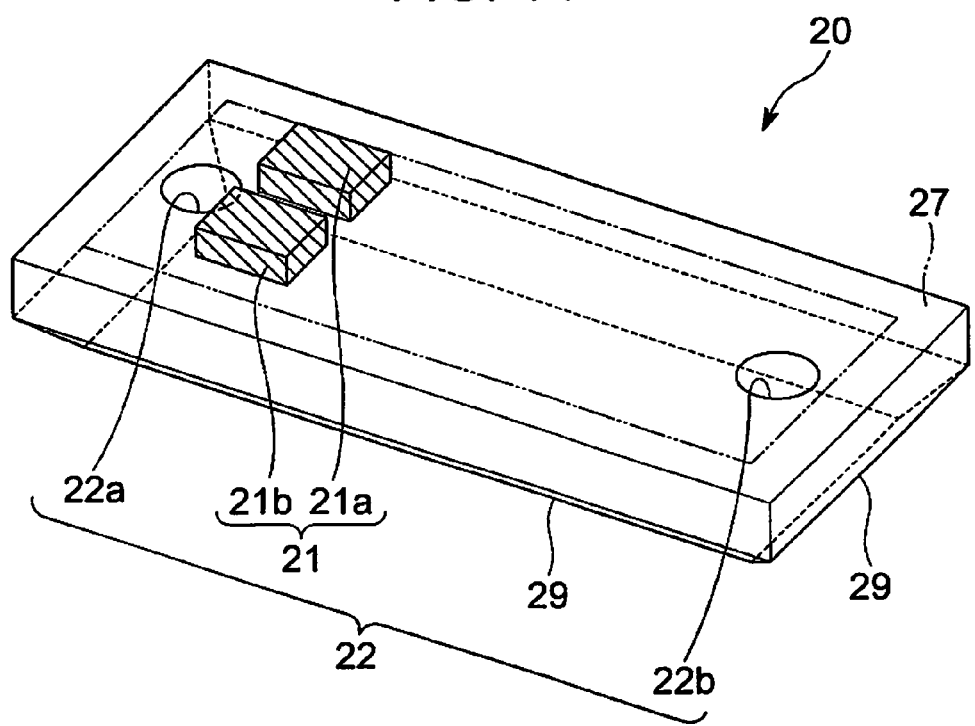
FIG. 14 is a process drawing of the case where the piezoelectric vibrator is manufactured along the flowchart shown in FIG. 9, and is a partial perspective view of the base substrate wafer which is formed into base substrates later.

Subsequently, a mount pattern forming step S23 for forming a plurality of pairs of the mount patterns 21 on the base substrate wafer 20 in the row and column directions by deposition, spattering, or the like is performed. At this time, the pair of mount patterns 21 are formed so as to be accommodated in the each cavity C when the plurality of cavities C are defined by superimposing the both wafers 20, 30 as shown in FIG. 14. In other words, since the pair of mount patterns 21 are not formed on the bonded surface 27 of the base substrate wafer 20, they are electrically disconnected from the bonding electrode film 32 of the lid substrate wafer 30, described later.

Figure 15:
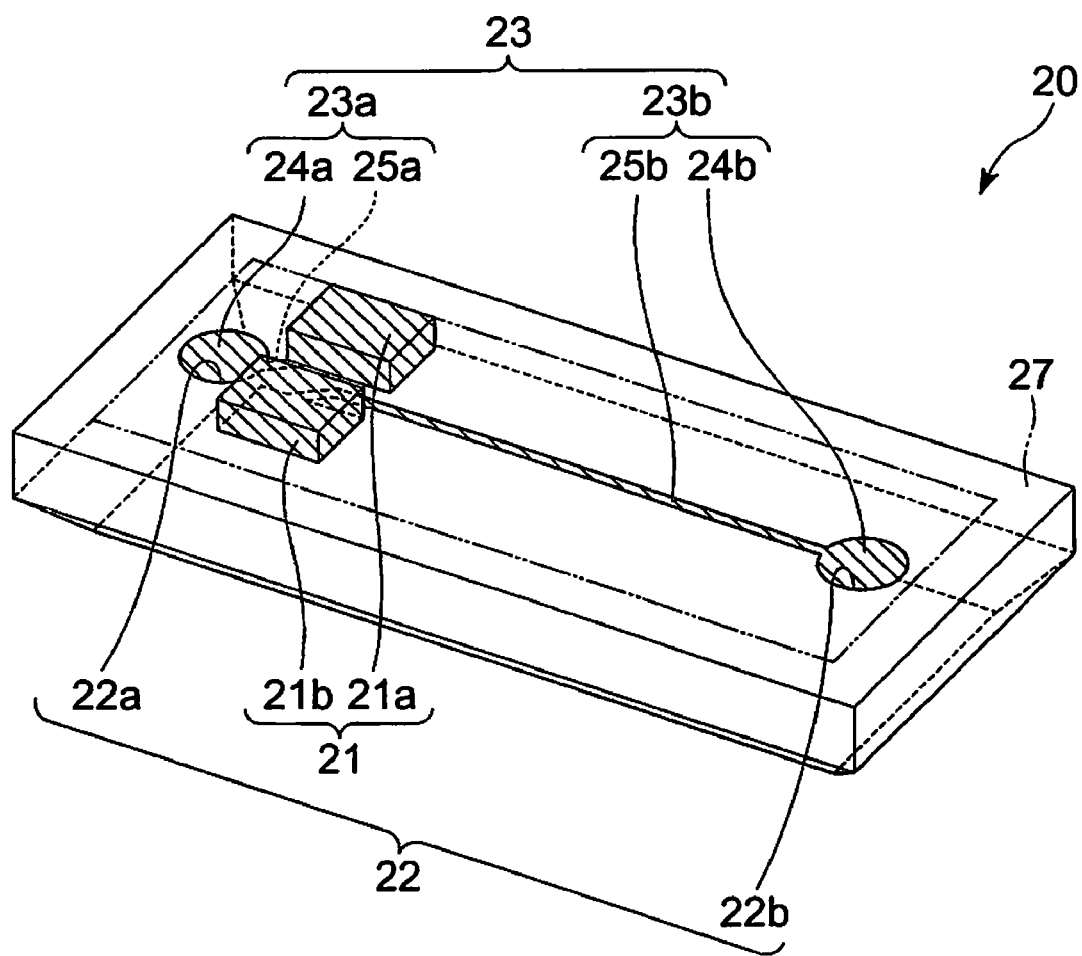
FIG. 15 is a process drawing of the case where the piezoelectric vibrator is manufactured along the flowchart shown in FIG. 9, and is a partial perspective view of the base substrate wafer which is formed into the base substrates later.

Subsequently, a through hole electrode forming step S24 for forming a plurality of pairs of the through electrodes 23 on the base substrate wafer 20 in the row and column directions by deposition, spattering, metal plating, or the like is performed. The pair of through electrodes 23 are formed in the each cavity C so as to be electrically connected to the pair of mount patterns 21 in the each cavity C respectively when the plurality of cavities C are defined by superimposing the both wafers 20, 30 as shown in FIG. 15. More specifically, as the pair of through electrodes 23, the first through hole electrode 24a and the first leading electrode film 25a, and the second through hole electrode 24b and the second leading electrode film 25b are formed in the each cavity C. Since the pair of through electrodes 23 are not formed on the bonded surface 27 of the base substrate wafer 20, they are electrically disconnected from the bonding electrode film 32 of the lid substrate wafer 30. Accordingly, conduction with the pair of mount patterns 21 via the pair of through electrodes 23 is achieved without being affected by the bonding electrode film 32 of the lid substrate wafer 30.

With the base wafer fabricating step S20 shown above, the base substrate wafer 20 as shown in FIG. 10 is formed.

Figure 16:
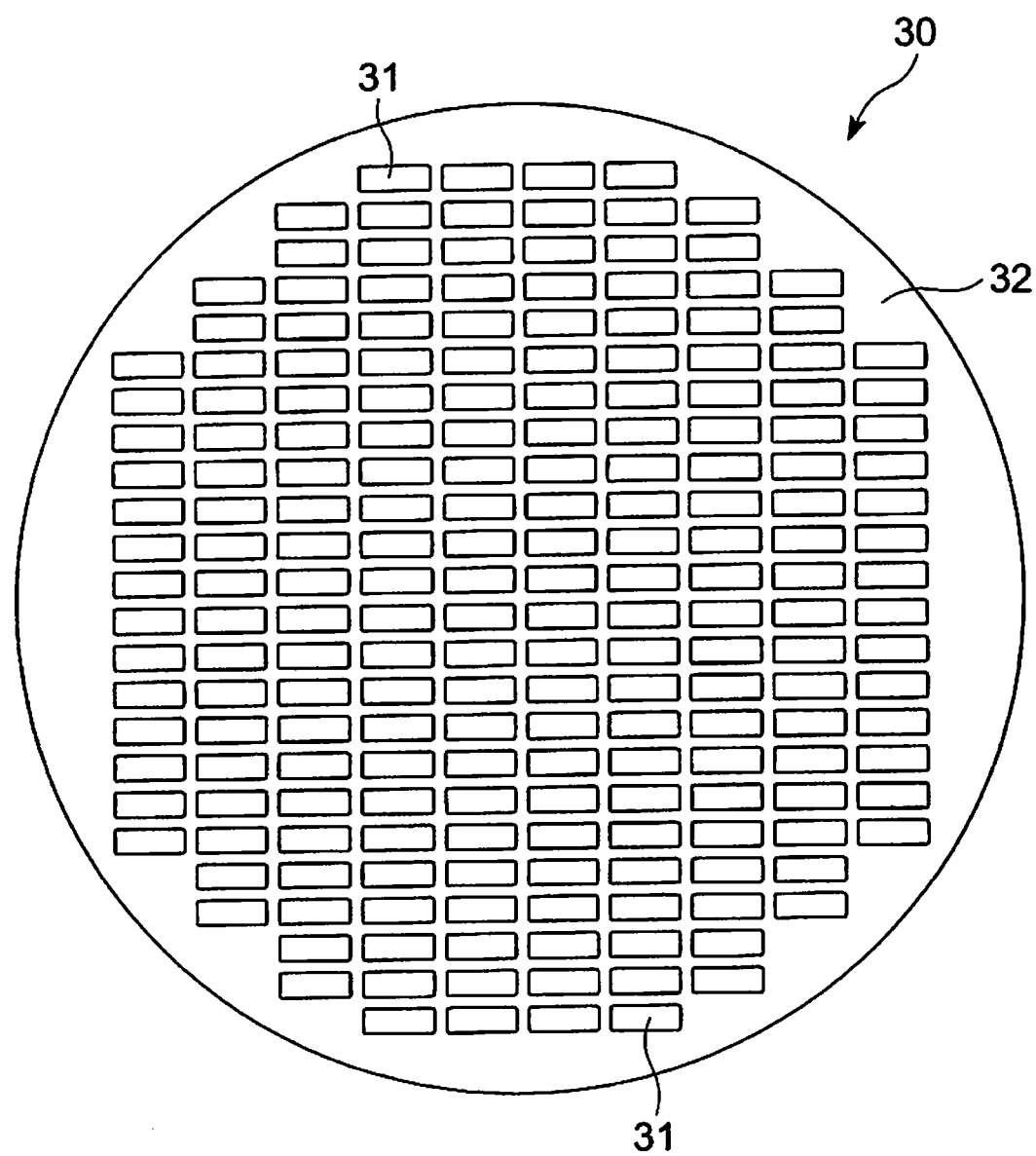
FIG. 16 is a process drawing of the case where the piezoelectric vibrator is manufactured along the flowchart shown in FIG. 9, and is a top view of a lid substrate wafer which is formed into lid substrates later.
Figure 17:
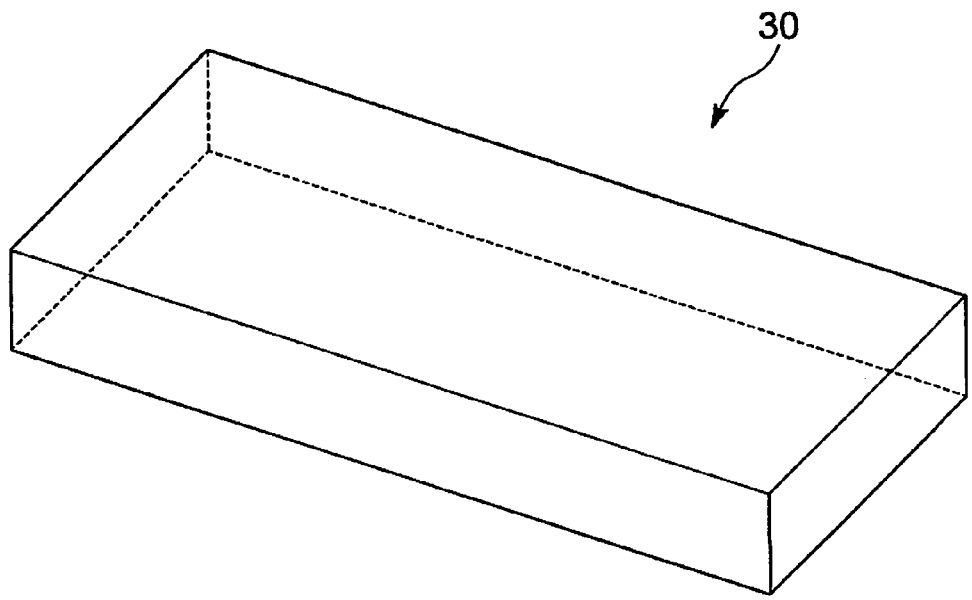
FIG. 17 is a process drawing of the case where the piezoelectric vibrator is manufactured along the flowchart shown in FIG. 9, and is a partial perspective view of the lid substrate wafer which is formed into the lid substrates later.
Figure 18:
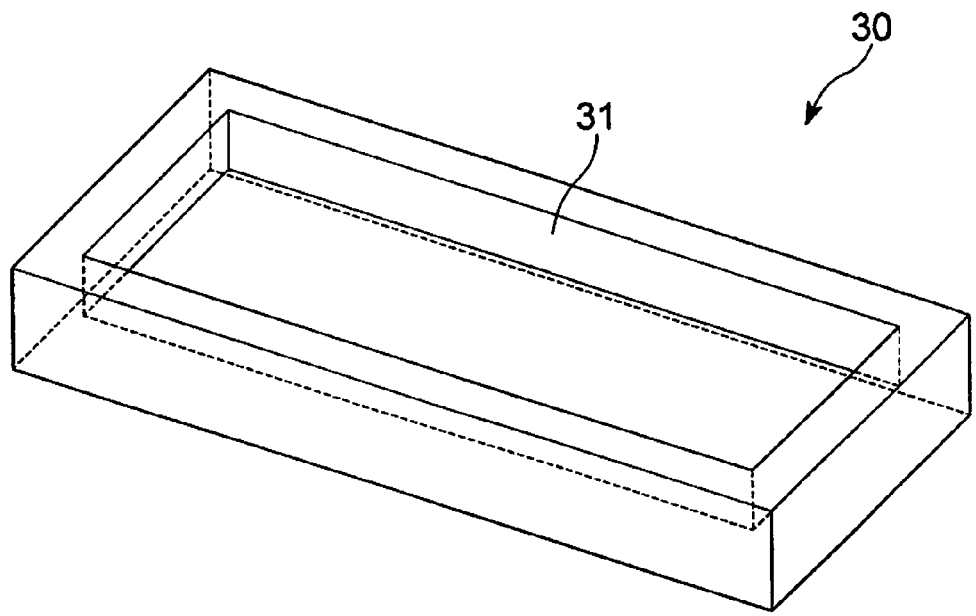
FIG. 18 is a process drawing of the case where the piezoelectric vibrator is manufactured along the flowchart shown in FIG. 9, and is a partial perspective view of the lid substrate wafer which is formed into the lid substrates later.
Figure 19:
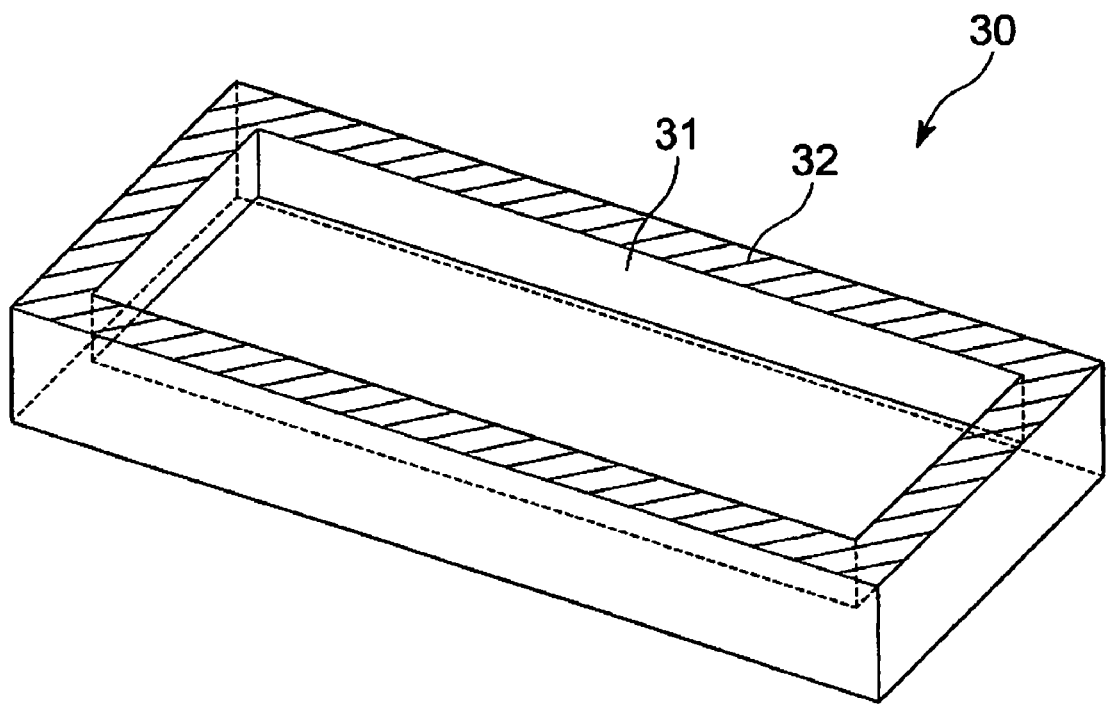
FIG. 19 is a process drawing of the case where the piezoelectric vibrator is manufactured along the flowchart shown in FIG. 9, and is a partial perspective view of the lid substrate wafer which is formed into the lid substrates later.

Then, a lid wafer fabricating step S30 for fabricating the lid substrate wafer 30 which is formed into the lid substrates 3 later to a state immediately before being subjected to the mount step S41 as shown in FIG. 16 is performed. In FIG. 17 to FIG. 19 used for description, the lid substrate 3 is shown in a state of being cut into a small piece instead of being in a wafer state for easy understanding of the drawing. Actually, however, the lid substrate wafer 30 in the wafer state is processed.

First of all, after having grinded the soda lime glass to a predetermined thickness and washed the same, as shown in FIG. 17, the base substrate wafer 20 of a disc shape having an affected layer on a top surface thereof removed by etching or the like is formed (S31). Then, as shown in FIG. 18, a cavity forming step S32 is performed by forming a plurality of the depressions 31 for the cavities C on one of the surfaces of the lid substrate wafer 30 in the row and column directions by etching or the like. Then, as shown in FIG. 19, a bonding electrode film forming step S33 for forming the bonding electrode film 32 on the bonded surface of the lid substrate wafer 30 by deposition, spattering, or the like is performed. Accordingly, the bonding electrode film 32 is provided in a state of surrounding the peripheries of the cavities C after having bonded the both wafers 20, 30.

With the lid wafer fabricating step S30 shown above, the lid substrate wafer 30 as shown in FIG. 16 is formed.

Figure 20:
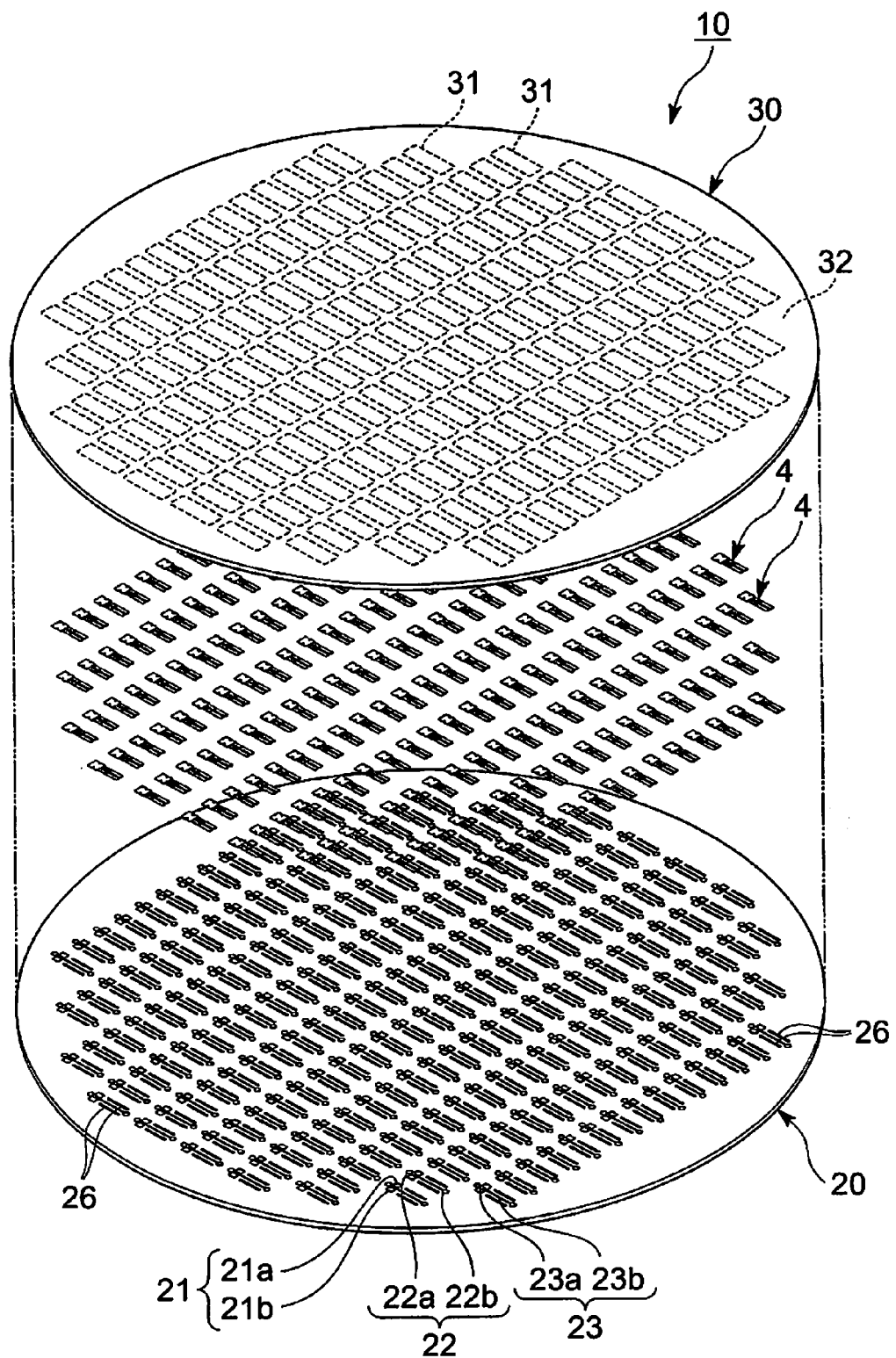
FIG. 20 is a process drawing of the case where the piezoelectric vibrator is manufactured along the flowchart shown in FIG. 9, and is an exploded perspective view of a piezoelectric vibrator wafer member which is formed by bonding the base substrate and the lid substrate.
Figure 21:
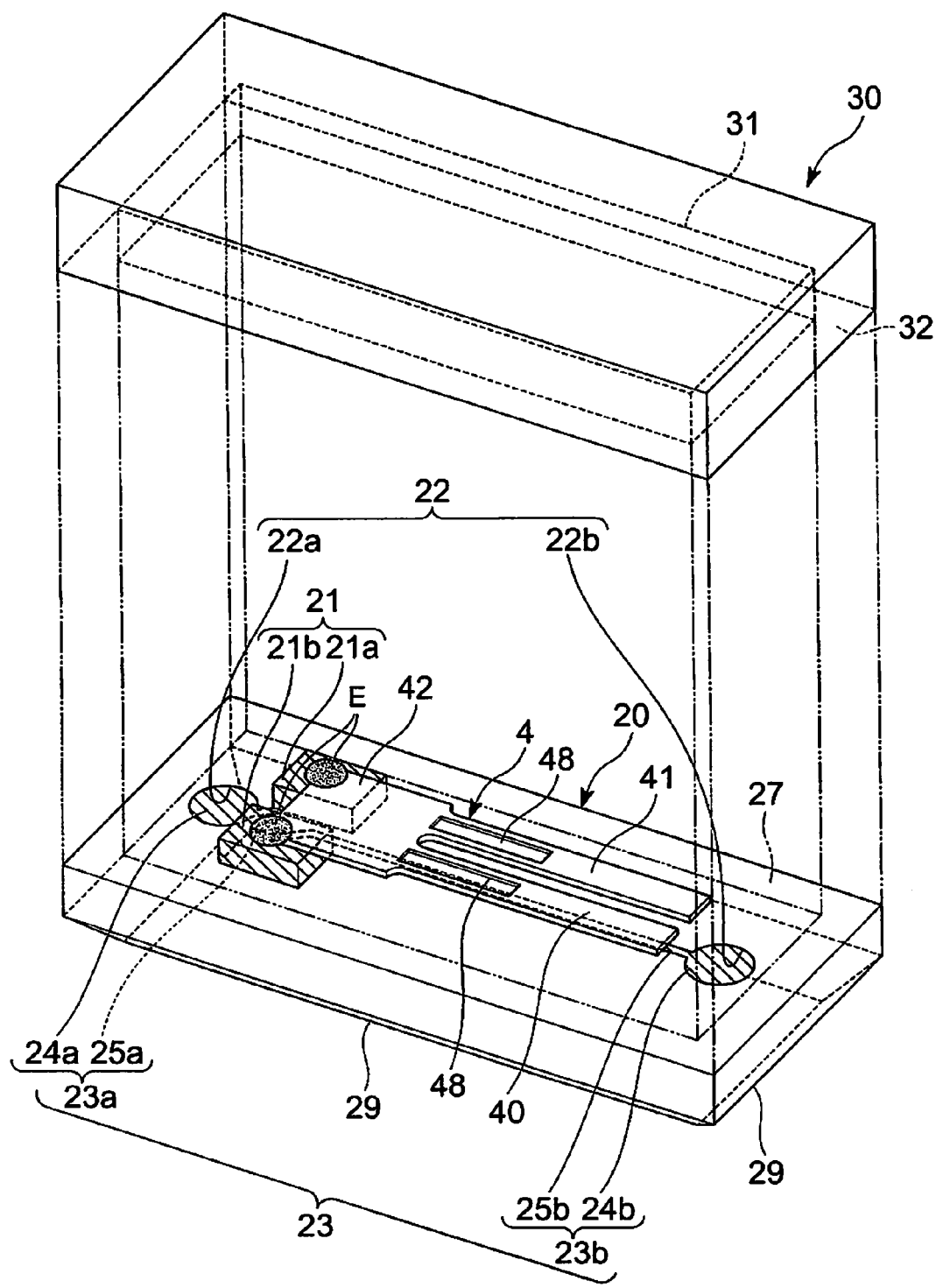
FIG. 21 is a process drawing of the case where the piezoelectric vibrator is manufactured along the flowchart shown in FIG. 9, and is a partial perspective view of the base substrate wafer and the lid substrate wafer.
Figure 22:
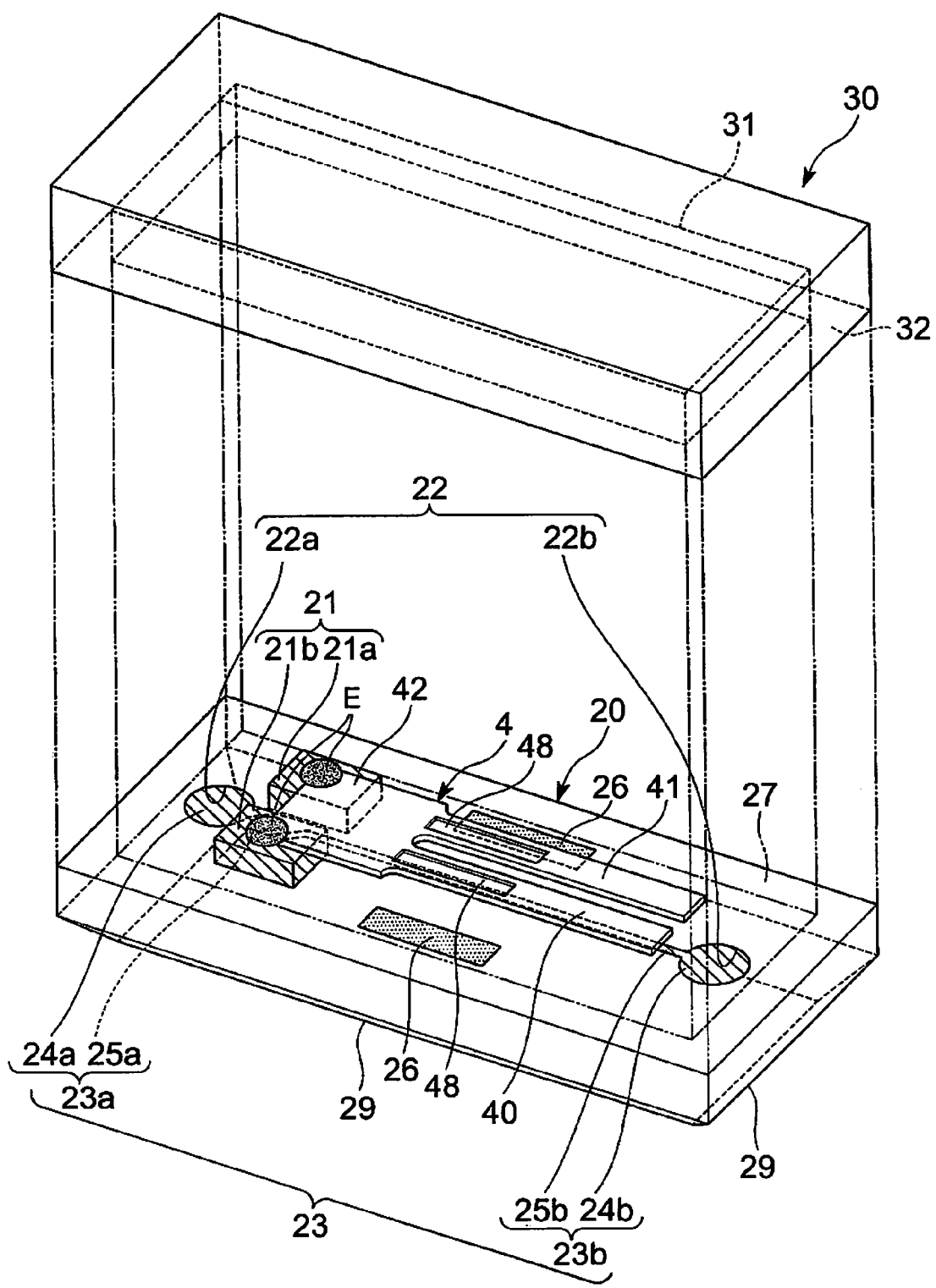
FIG. 22 is a process drawing of the case where the piezoelectric vibrator is manufactured along the flowchart shown in FIG. 9, and is a partial perspective view of the base substrate wafer and the lid substrate wafer.

Subsequently, a wafer body fabricating step S40 for fabricating a piezoelectric vibrator wafer member 10 is performed by bonding the plurality of piezoelectric vibrating strips 4 fabricated as described above, the base substrate wafer 20, and the lid substrate wafer 30 as shown in FIG. 20. In FIG. 20, a state in which the piezoelectric vibrator wafer member 10 is exploded is shown for the sake of easy understanding of the drawing. In FIG. 20 to FIG. 22, illustration of the pair of exciting electrodes 45, the leading electrodes 49, 50, the pair of mount electrodes 46, 47, and the weight metal film 51 of the piezoelectric vibrating strip 4 are omitted for the sake of easy understanding of the drawing. In FIG. 21 and FIG. 22, the base substrate 2 and the lid substrate 3 in the state of being cut into the small piece are shown instead of that in the wafer state, and the illustration of the respective electrode films 43, 44, 46, 47, 49, 50 and the weight metal film 51 on the piezoelectric vibrating strip 4 is omitted for the sake of easy understanding of the drawing.

As shown in FIG. 21, a mount step S41 for mounting the piezoelectric vibrating strips 4 on the base substrate wafer 20 so that the pairs of mount electrodes 46, 47 are superimposed on the plurality of pairs of mount patterns 21 is performed. Specifically, after the base portion 42 of the piezoelectric vibrating strip 4 is placed on the pair of mount patterns 21 and is mounted with the conductive adhesive agent E. Accordingly, the first mount pattern 21a is electrically connected to the one mount electrode 46 of the piezoelectric vibrating strip 4, and the second mount pattern 21b is electrically connected to the other mount electrode 47 of the piezoelectric vibrating strip 4.

Then, a superimposing step S42 for superimposing the both wafers 20, 30 and storing the piezoelectric vibrating strips 4 in the plurality of cavities C respectively is performed. At this time, alignment to the correct position may be achieved by using a reference mark, not shown, as an index. Also, at this time, the getter materials 26 are also formed so as to be accommodated in the plurality of cavities C as shown in FIG. 22 by deposition, spattering, or the like. Accordingly, the getter materials 26 are encapsulated in the respective cavities C after having bonded the both wafers 20, 30.

Subsequently, a bonding step S43 for anodically bonding the superimposed both wafers 20, 30 using the bonding electrode film 32 is performed. Specifically, the both wafers 20, 30 are placed in an anodic bonding device, not shown, and a predetermined voltage is applied to the bonding electrode film 32 interposed between the base substrate wafer 20 and the lid substrate wafer 30 at a predetermined temperature atmosphere. Then, an electrochemical reaction occurs in an interface between the bonding electrode film 32 and the base substrate wafer 20, and the both are tightly adhered to each other and anodically bonded. Accordingly, the piezoelectric vibrator wafer member 10 including the base substrate wafer 20 and the lid substrate wafer 30 bonded with the intermediary of the bonding electrode film 32 is obtained. Accordingly, as shown in FIG. 20, the piezoelectric vibrator wafer member 10 having the piezoelectric vibrating strips 4 encapsulated in the plurality of cavities C formed between the both wafers 20, 30 is fabricated.

Subsequently, the gettering step S51 for adjusting the degrees of vacuum in the interiors of the cavities C is performed by heating the getter materials 26 encapsulated in the respective cavities C of the piezoelectric vibrator wafer member 10. Specifically, the piezoelectric vibrator wafer member 10 is stored in the jig, not shown, and then set in an adjusting device, not shown. Then, a predetermined voltage is applied on the pairs of through electrodes 23 in the adjusting device to vibrate the piezoelectric vibrating strips 4 and the series resonance resistance values are measured. On the basis of the series resonance resistance values, the gettering is performed for an adequate number of times by heating the getter materials 26 applying a laser beam from the side of the base substrate wafer 20.

It is preferable to measure the series resonance resistance values of a plurality of the piezoelectric vibrating strips 4 simultaneously. In other words, it is preferable to apply the predetermined voltage to the plurality of pairs of the through electrodes 23 simultaneously to vibrate the plurality of piezoelectric vibrating strips 4, and measure the respective series resonance resistance values. Accordingly, the time period consumed for measuring the series resonance resistance values is reduced, so that an operation efficiency in the manufacture of the piezoelectric vibrator 1 is improved.

As a method of determining the adequate number of times of the gettering, there is a method of setting a threshold value of the series resonance resistance value for the type of the piezoelectric vibrator 1 in advance, and determining the number of times at which the series resonance resistance value falls below the threshold value as being adequate. It is also possible to determine the same by performing the gettering after having stored the series resonance resistance value immediately before the gettering, calculating the ratio of the change with respect to the series resonance resistance value immediately after the gettering, and comparing the ratio of the change with a preset value.

Subsequently, a cutting step S52 for cutting the piezoelectric vibrator wafer member 10 into the individual piezoelectric vibrators 1 with a laser beam or the like is performed. Specifically, the piezoelectric vibrator wafer member 10 is stored in the jig, not shown, and then cut by a cutting device, not shown.

After having ended the cutting step S52, an external electrode forming step (S53) for forming conductive films as the first external electrode 61 and the second external electrode 62 on the base substrate wafer 20 by spattering, deposition, or the like is performed.

Subsequently, a fine adjustment step (frequency adjustment step) for fine-adjusting the frequency of the piezoelectric vibrator 1 individually to cause the same to fall within a predetermined range (S54) is performed. Specifically, the piezoelectric vibrating strip 4 is vibrated by applying a voltage to the both external electrodes 61, 62. Then, a laser beam is applied from the outside through the lid substrate 3 while measuring the frequency, and causes the fine adjustment film 51b of the weight metal film 51 to evaporate. Accordingly, since the weights of the distal ends of the pair of vibrating arm portions 40, 41 are changed, and the frequency of the piezoelectric vibrating strip 4 can be fine-adjusted so as to fall within the predetermined range of the nominal frequency.

Subsequently, an inspection of the electric characteristics in the interior is performed. In other words, the resonance frequency, a resonant resistance value, a drive level value and the like (an existing power dependency of the resonance frequency and the resonant resistance value) of the piezoelectric vibrating strip 4 are measured and checked. An insulative resistance characteristic value and the like is also checked. Then, finally, an appearance inspection of the piezoelectric vibrator 1 is performed to finally check dimensions, quality, and the like (S55). Accordingly, the piezoelectric vibrator 1 as shown in FIG. 1 is manufactured.

According to the piezoelectric vibrator manufacturing method described above, specifically, when adjusting the degree of vacuum in the interior of the cavity C in the gettering step S51, the pair of through electrodes 23 are used to vibrate the piezoelectric vibrating strip 4 encapsulated in the cavity C, and the getter materials 26 are heated while measuring the series resonance resistance value of the piezoelectric vibrating strip 4. In other words, the piezoelectric vibrating strip 4 can be rendered conductive to the outside via the pair of mount electrodes 46, 47, the pair of mount patterns 21, and the pair of through electrodes 23, as described above. Therefore, by applying the predetermined voltage to the pair of through electrodes 23, the voltage can be applied to the pair of exciting electrodes 45, and hence the piezoelectric vibrating strip 4 can be vibrated.

In addition, the pair of through electrodes 23 and the pair of mount patterns 21 are provided respectively in all the cavities C of the piezoelectric vibrator wafer member 10, and are electrically disconnected from the bonding electrode film 32. Therefore, the individual piezoelectric vibrating strips 4 can be vibrated separately. Therefore, the degrees of vacuum in the interiors of the cavities C can be adjusted individually before cutting the piezoelectric oscillator wafer member 10 while measuring the series resonance resistance values of the individual piezoelectric vibrators 1 before cutting the piezoelectric vibrator wafer member 10. Therefore, the gettering adjustment can be performed without performing the gettering excessively or insufficiently, and the degrees of vacuum in the interiors of the cavities C can be brought near under the vacuum as much as possible. Therefore, the adequate series resonance resistance value can be secured. Consequently, the piezoelectric vibrators 1 with improved quality and improved performance are fabricated.

Also, since the adequate series resonance resistance value is secured by performing the gettering adjustment before performing the cutting step S52, it is not necessary to set an infinite number of piezoelectric vibrators 1 cut into small pieces in the adjusting device individually as in the conventional art. Therefore, the cost reduction and improvement of the operation efficiency in the manufacture of the piezoelectric vibrators 1 are achieved. Also, since the excessive gettering can be prevented, the frequency of generation of nonconforming products which cannot be repaired can significantly be reduced.

Since the getter materials 26 are formed on the base substrate wafer 20, an effect of heating on the piezoelectric vibrating strips 4 can be minimized when heating the getter materials 26 by the gettering step S51. Therefore, further improvement in the quality and improvement in the performance are achieved.

Also, the gettering adjustment is performed by heating the getter materials 26 using the laser beam. In addition, the laser beam is emitted from the side of the base substrate wafer 20 where the getter materials 26 are formed.

Here, an optical flux generally refracts on an interface of a substance having a different index of refraction if such substance exists on its optical path. Therefore, in order to cause the optical flux to enter an intended point, the refraction is needed to be taken into consideration. Therefore, if the number of times of refraction is large, it is difficult to cause the optical flux to enter the intended point.

However, since the laser beam is emitted from the side of the base substrate wafer 20 where the getter materials 26 are formed in this embodiment, the refraction of the laser beam for heating the getter materials 26 may be limited to the time only when entering the base substrate wafer 20. Accordingly, an effect of the refraction can be minimized, and the laser beam can be emitted to the intended points of the getter materials 26 with high degree of accuracy. Therefore, the gettering adjustment can be performed more accurately.

Second Embodiment

Referring now to FIG. 23 to FIG. 26, the piezoelectric vibrator manufacturing method and the piezoelectric vibrator manufactured by this manufacturing method according to a second embodiment of the present invention will be described. In the second embodiment, the same parts as those in the first embodiment are designated by the same reference numerals and the description will be omitted, and only different points are described.

Figure 23:
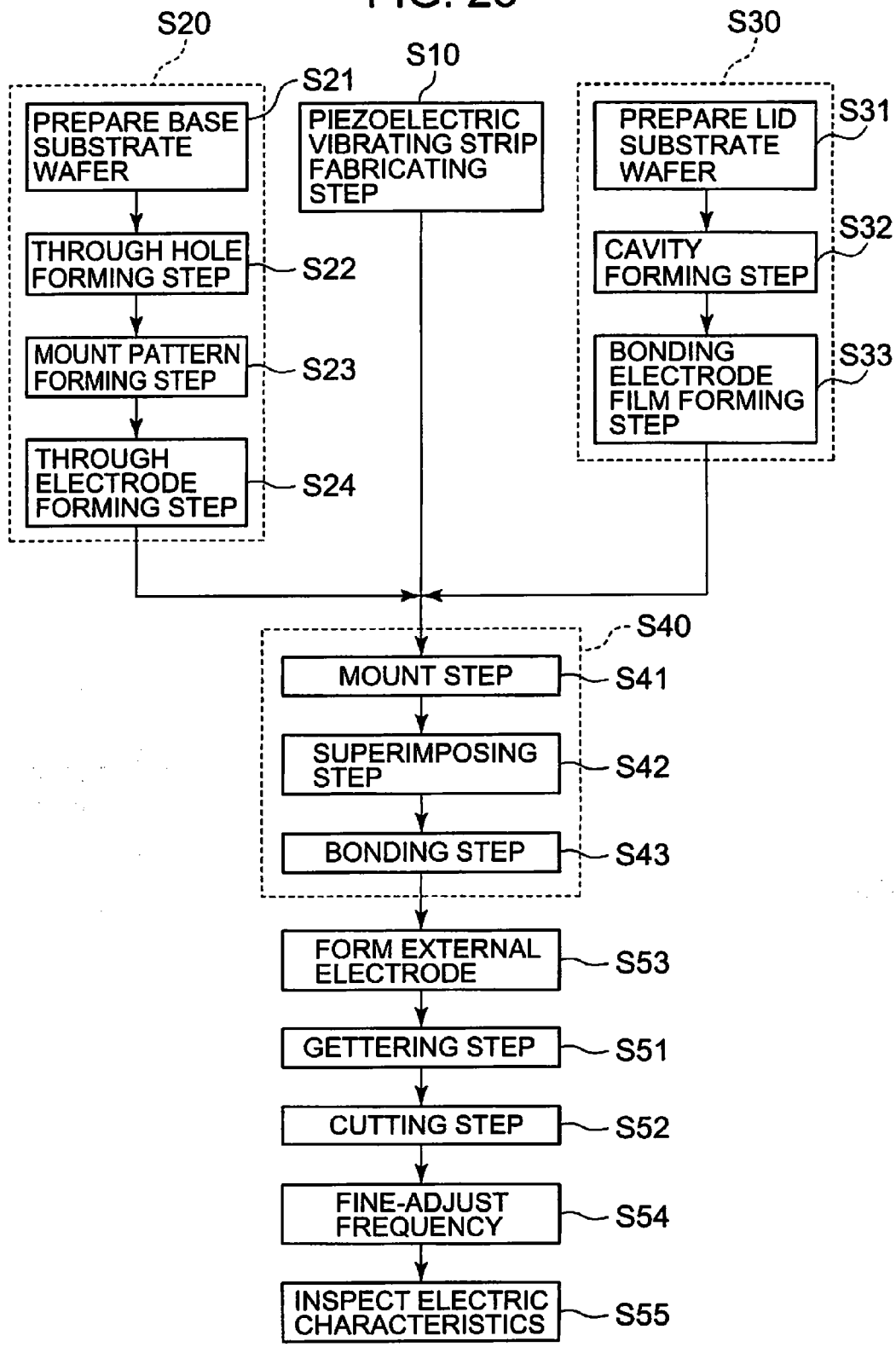
FIG. 23 is a flowchart of the piezoelectric vibrator manufacturing method according a second embodiment of the present invention.

As shown in a flowchart in FIG. 23, in the piezoelectric vibrator manufacturing method in this embodiment, the external electrode forming step (S53) is performed before the gettering step (S51). The plurality of series resonance resistance values of the piezoelectric vibrating strips 4 encapsulated in the cavities C are measured simultaneously in the gettering step (S51). The piezoelectric vibrator manufactured by the manufacturing method in this embodiment is the same as the piezoelectric vibrator 1 in the first embodiment described above.

The piezoelectric vibrator manufacturing method in this embodiment will be described below.

First of all, the procedure to the wafer body fabricating step (S40) is performed in the same manner as the first embodiment described above. As the base substrate wafer 20, a transparent one is preferably used.

Figure 24:
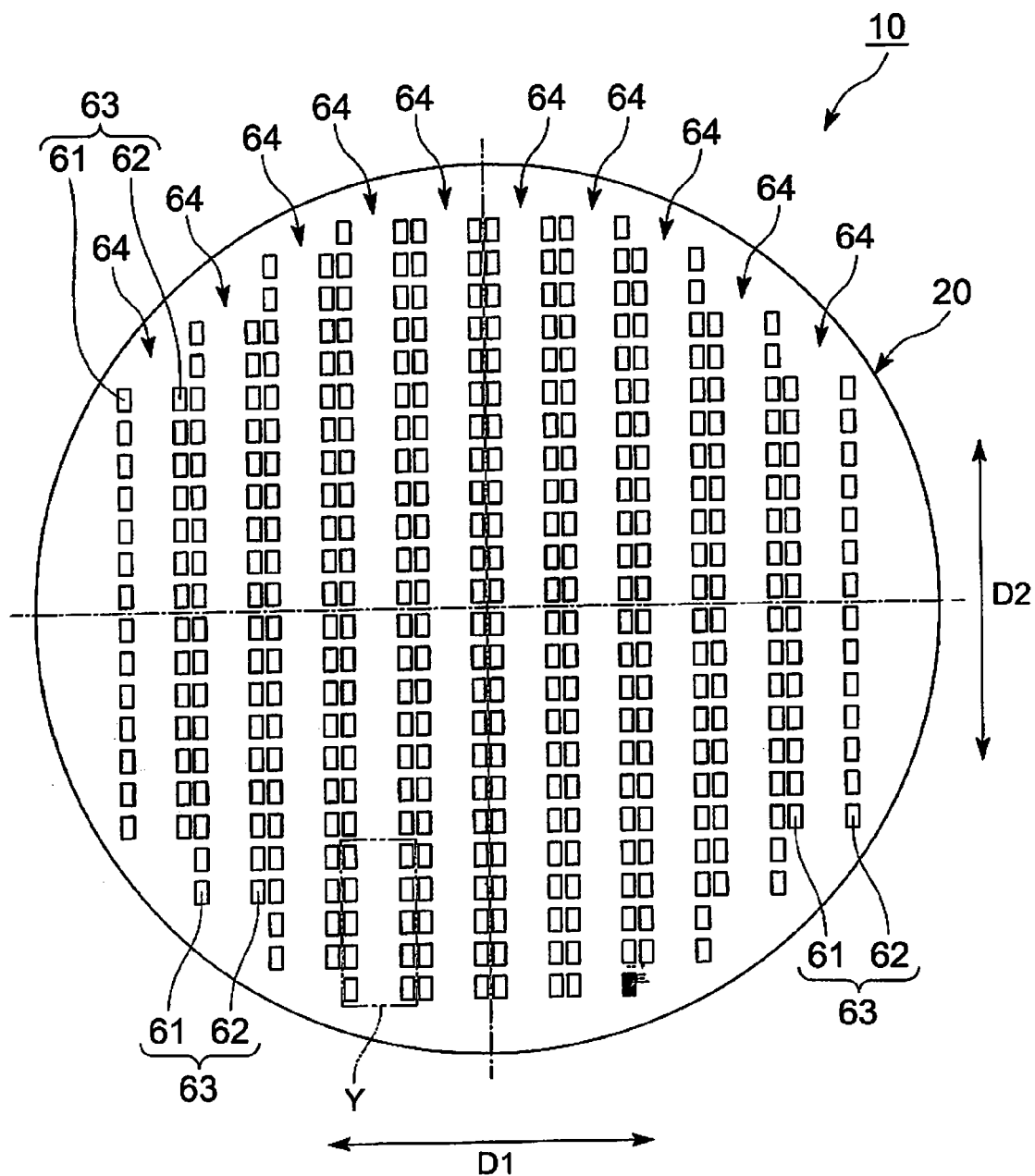
FIG. 24 is a process drawing of a case where the piezoelectric vibrator is manufactured along the flowchart shown in FIG. 23, and is a drawing of the piezoelectric vibrator wafer member after having performed an external electrode forming step viewed from a bottom surface side of the base substrate wafer.

Subsequently, as shown in FIG. 24, a plurality of pairs of external electrodes 63 each including the first external electrode 61 and the second external electrode 62 on the bottom surface side of the base substrate wafer 20 of the piezoelectric vibrator wafer member 10 (external electrode forming step; S53). Accordingly, the plurality of pairs of external electrodes 63 are formed in the row and column directions on the bottom surface side of the base substrate wafer 20 of the piezoelectric vibrator wafer member 10. In FIG. 24, the illustration of the notched portions 29 formed on the base substrate wafer 20 is omitted for easy understanding of the drawing.

Here, arrangement of the each pair of external electrodes 63 formed in the external electrode forming step will be described in detail.

In this embodiment, the first external electrode 62 and the second external electrode 63, which are electrically connected respectively to the pair of through electrodes 23 in the same cavity C are formed equidistantly in one direction D1 in the row and column directions. Also, the plurality of pairs of the external electrodes 63 are formed so as to extend along the other direction D2 orthogonal to the one direction D1 in the row and column direction. In addition, by forming clearances between the pairs of external electrodes 63 adjacent in the other direction D2, the pairs of external electrodes 63 adjacent in the other direction D2 are formed so as to be electrically disconnected from each other.

As described above, by forming the pair of external electrodes 63, a plurality of pairs of external electrode rows 64 including the plurality of pairs of electrically disconnected external electrodes 63 extended along the other direction D2 are formed at a distance in the one direction D1.

Figure 25:
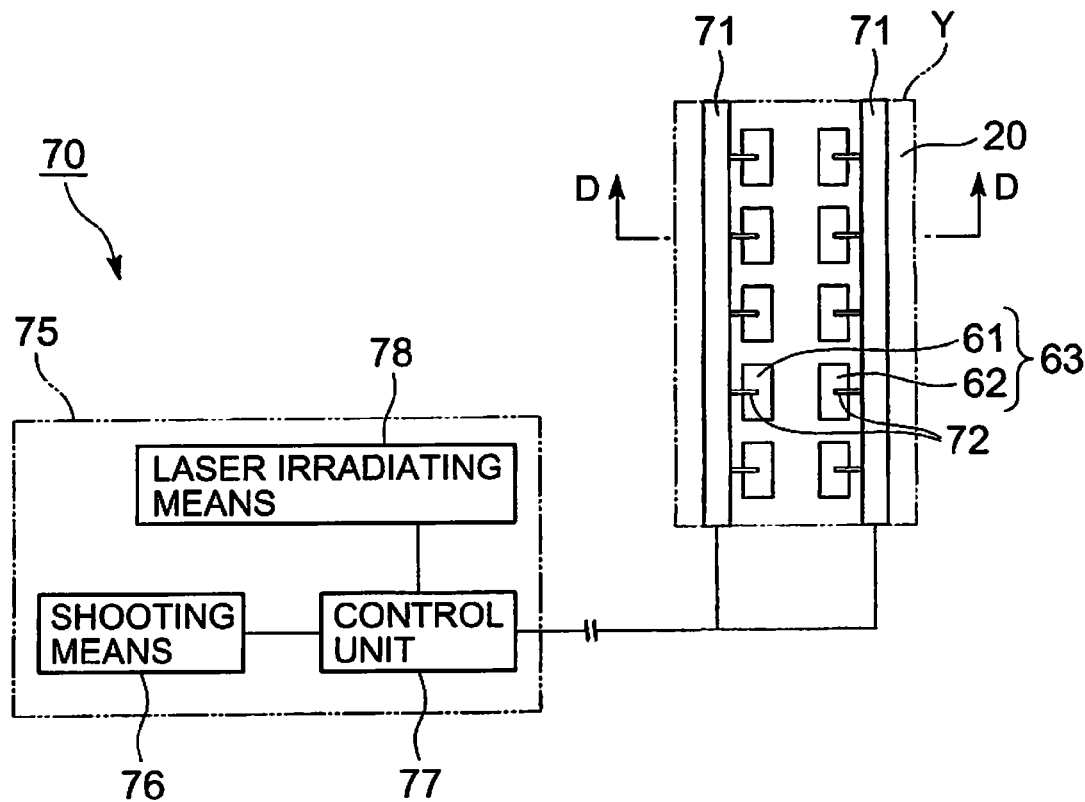
FIG. 25 is a process drawing of the case where the piezoelectric vibrator is manufactured along the flowchart shown in FIG. 23, and is a drawing showing a state in which a gettering step is performed using an adjusting device in an area Y of the piezoelectric vibrator wafer member shown in FIG. 24.
Figure 26:
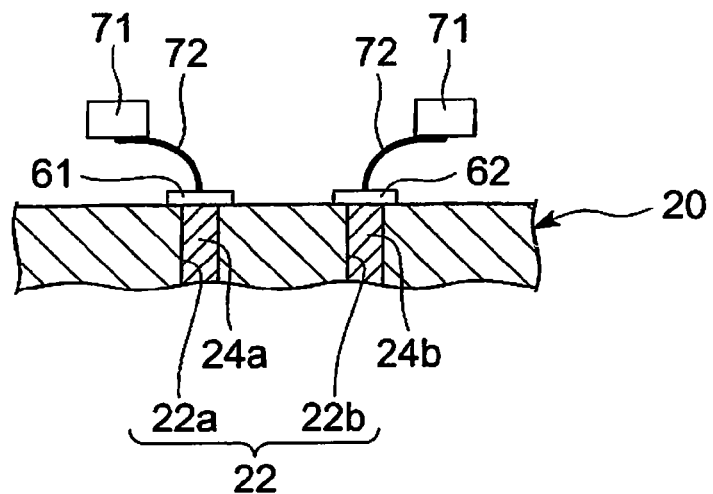
FIG. 26 is a cross-sectional view taken along an arrow D-D in FIG. 25.

Subsequently, as shown in FIG. 25 and FIG. 26, the degrees of vacuum in the interiors of the cavities C are adjusted by heating the getter materials 26 encapsulated in the respective cavities C of the piezoelectric vibrator wafer member 10 (gettering step; S51). In this case, the procedure is performed while measuring the plurality of series resonance resistance values of the piezoelectric vibrating strips 4 simultaneously using an adjusting device 70 shown in FIG. 25. The adjusting device 70 shown in FIG. 25 shows a state of applying to the pairs of external electrodes 63 in an area Y shown by a long and short dash line of the piezoelectric vibrator wafer member 10 shown in FIG. 24 by a pair of measuring arm portions 71 described later.

The adjusting device 70 will be described now before describing the gettering step.

The adjusting device 70 includes the pair of measuring arm portions 71 for applying a voltage to the first and second external electrodes 61, 62, an adjusting device body 75 configured to control the pair of measuring arm portions 71, and a set portion, not shown, on which the piezoelectric vibrator wafer member 10 is set.

The pair of measuring arm portions 71 extend in parallel to each other and are provided at a distance from each other in the illustrated example, and the distance is larger than, for example, the distance between the pair of external electrodes 63. The length of the pair of measuring arm portions 71 is half a length of the pair of the pair of external electrode rows 64 positioned near the center in the one direction D1 of the base substrate wafer 20 along the other direction D2, for example.

The pair of measuring arm portions 71 are provided with a plurality of pairs of contact lines 72 for applying a predetermined voltage to the pairs of external electrodes 63.

The pair of contact lines 72 are provided respectively at positions on the pair of measuring arm portions 71 opposed to each other. The plurality of pairs of contact lines 72 are provided equidistantly along the direction of extension of the pair of measuring arm portions 71 and, in the illustrated example, the distance is equivalent, for example, to the distance between the centers of the adjacent pairs of external electrodes 63 along the other direction D2.

As shown in FIG. 26, the pair of contact lines 72 are formed of metallic wire members, which extend from lower surfaces of the respective measuring arm portions 71 inward toward the other measuring arm portions 71 and then extend so as to curve downward as it goes further inward.

Also, the respective pairs of contact lines 72 are electrically connected to a control unit 77, described later, respectively and are configured to be controlled independently by the control unit 77.

As shown in FIG. 25, the adjusting device body 75 includes shooting means 76 for shooting an image of the piezoelectric vibrator wafer member 10 set on the set portion, the control unit 77 configured to determine the positions of the plurality of pairs of external electrodes 63 as the target of application for applying a predetermined voltage on the basis of the image shot by the shooting means 76 and to control the pair of the measuring arm portions 71, and laser irradiating means 78 configured to be controlled by the control unit 77.

In this embodiment, the control unit 77 has a configuration which is capable of measuring the series resonance resistance values and the frequencies of the piezoelectric vibrating strips 4 electrically connected to the pairs of external electrodes 63 when an application to the pairs of external electrodes 63 is done by the pairs of contact lines 72.

Subsequently, the gettering step performed using the adjusting device 70 described above will be described.

First of all, an operator of the adjusting device 70 sets the piezoelectric vibrator wafer member 10 on the set portion of the adjusting device 70 in a state in which the image of the bottom surface side of the base substrate wafer 20 can be shot by the shooting means 76. In this case, the piezoelectric vibrator wafer member 10 may be set in a state of being stored in a jig, not shown.

Subsequently, the operator causes the shooting means 76 of the adjusting device 70 to shoot the image of the plurality of pairs of external electrodes 63 formed on the base substrate wafer 20 using an operating unit or the like, not shown, electrically connected to the control unit 77.

Subsequently, the control unit 77 determines the positions where the respective pairs of external electrodes 63 are formed on the basis of the image acquired by the shooting means 76.

Subsequently, the control unit 77 sets the target of application on the basis of the positions of the determined respective pairs of external electrodes 63. In this embodiment, the control unit 77 sets an entire portion or a part of the pair of external electrode rows 64 (for example, the pairs of external electrodes 63 or the like positioned in the area Y shown in FIG. 24 described above) as the target of application.

Subsequently, the control unit 77 moves the pair of measuring arm portions 71 so that the plurality of pairs of contact lines 72 come into contact with the plurality of pairs of external electrodes 63 set as the target of application as shown in FIG. 25 and FIG. 26.

Subsequently, the control unit 77 applies simultaneously to the plurality of pairs of external electrodes 63 as the target of application, and applies a predetermined voltage to the plurality of pairs of through electrodes 23 to vibrate the piezoelectric vibrating strips 4, and then measures the series resonance resistance values. Then, the control unit 77 performs the gettering by causing the laser irradiating means 78 to emit the laser beam on the basis of the measured series resonance resistance values and heating the getter materials 26. When the base substrate wafer 20 is transparent, heating of the getter materials 26 by the laser beam can further be ensured.

Subsequently, after having performed the gettering adequately in the cavities C in which the plurality of pairs of external electrodes 63 as the current target of application are provided, the control unit 77 changes the target of application to another plurality of pairs of external electrodes 63, so that the gettering is adequately performed for all the cavities C in the piezoelectric vibrator wafer member 10.

The gettering step is now ended.

According to the piezoelectric vibrator manufacturing method as described above, the same effects and advantages as the first embodiment described above are achieved.

Also, since the series resonance resistance values of the plurality of piezoelectric vibrating strips 4 can be measured simultaneously by vibrating the plurality of piezoelectric vibrating strips 4 simultaneously, the time period consumed for measuring the series resonance resistance values is reduced, and hence the operation efficiency in the manufacture of the piezoelectric vibrator 1 can further be improved.

Also, since the external electrode forming step is performed prior to the gettering step, when applying to the pairs of through electrodes 23 in the gettering step, the electrode for application such as the pairs of contact lines 72 or the like may be brought into contact with the pairs of external electrodes 63 having a larger surface area than the pairs of through electrodes 23. Therefore, application to the pairs of through electrodes 23 is achieved easily, so that the operation efficiency in the manufacture of the piezoelectric vibrator 1 is further improved.

Third Embodiment

Figure 27:
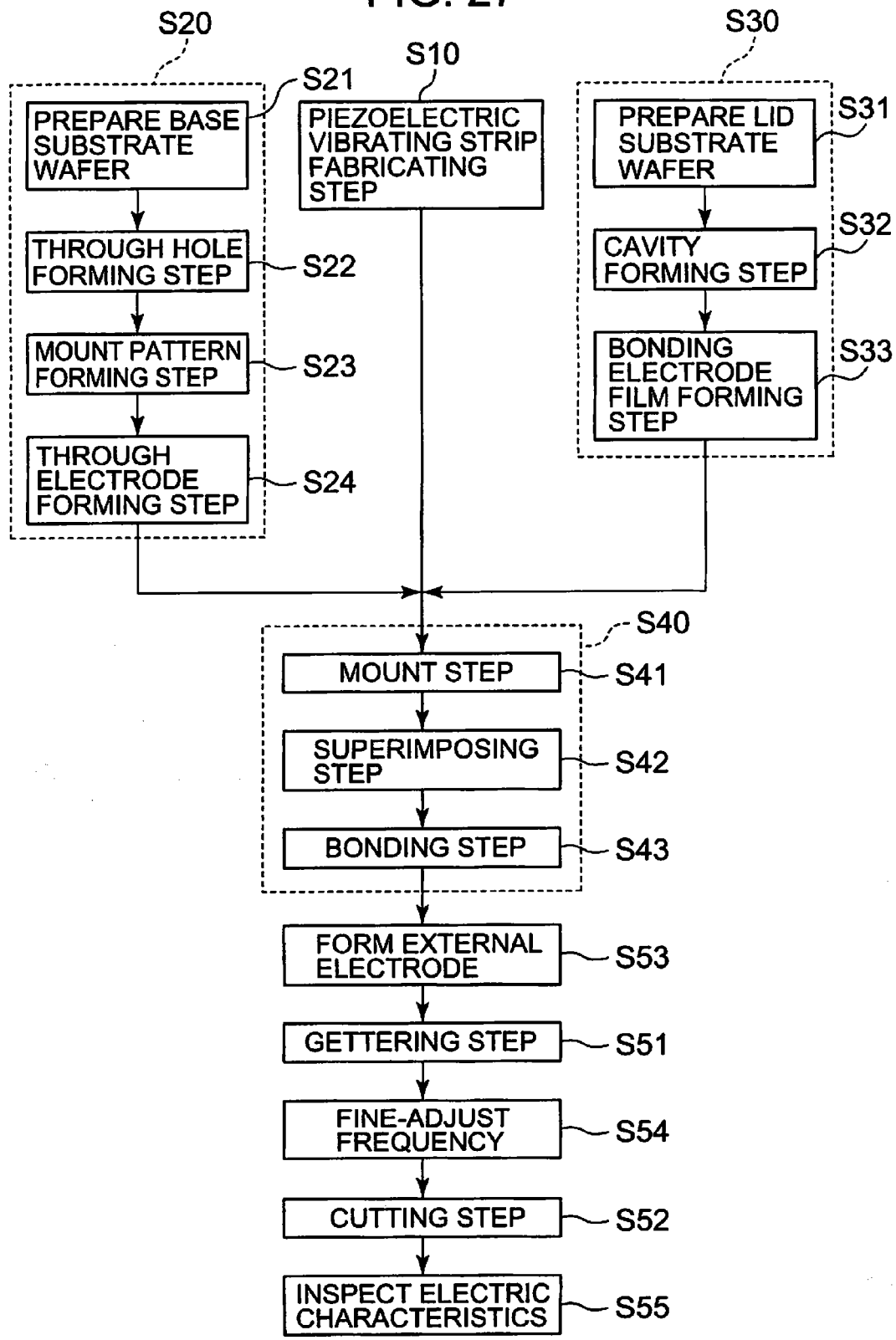
FIG. 27 is a flowchart of the piezoelectric vibrator manufacturing method according a third embodiment of the present invention.

Referring now to FIG. 27, the piezoelectric vibrator manufacturing method and the piezoelectric vibrator manufactured by this manufacturing method according to a third embodiment of the present invention. In the third embodiment, the same parts as the components in the second embodiment are designated by the same reference numerals and the description will be omitted, and only different points are described.

As shown in the flowchart in FIG. 27, in the piezoelectric vibrator manufacturing method in this embodiment, the fine adjustment step (S54) is performed after the bonding step (S43) and before the cutting step (S52). Then, the gettering step (S51) is performed prior to the fine adjustment step (S54). The piezoelectric vibrator manufactured by the manufacturing method in this embodiment is the same as the piezoelectric vibrator 1 in the second embodiment described above.

The piezoelectric vibrator manufacturing method in this embodiment will be described below.

First of all, the procedure to the gettering step (S51) is performed in the same manner as the second embodiment described above.

Subsequently, the fine adjustment step is performed in the state of the piezoelectric vibrator wafer member 10. In this case, the frequencies of the plurality of piezoelectric vibrating strips 4 encapsulated in the cavities C are measured simultaneously using the adjusting device 70 shown in the second embodiment.

According to the piezoelectric vibrator manufacturing method as described above, the same effects and advantages as the second embodiment described above are achieved.

Also, by the fine adjustment step, the piezoelectric vibrating strips 4 encapsulated in the cavities C are vibrated using the pairs of through holes 23 and the frequency adjustment is performed while measuring the frequencies of the piezoelectric vibrating strips 4 when adjusting the frequencies of piezoelectric vibrating strips 4. Here, even in the state of the piezoelectric vibrator wafer member 10, the individual piezoelectric vibrating strips 4 can be vibrated separately via the pairs of through holes 23 and the pairs of mount patterns 21, as described above. Therefore, the frequency adjustment can be performed individually while measuring the frequencies of the individual piezoelectric vibrators 1 before cutting the piezoelectric oscillator wafer member 10. Accordingly, the frequencies of the piezoelectric vibrators 1 can be adjusted adequately, and vibration in the range of the nominal frequency is achieved, so that improvement of the quality and improvement of the performance of the piezoelectric vibrators 1 are achieved.

Also, since the frequencies of the piezoelectric vibrators 1 can be caused to fall within the nominal frequency by performing the frequency adjustment before performing the cutting step, a complicated work to store the infinite number of piezoelectric vibrators 1 cut into small pieces individually in the jigs and set the jigs into the frequency adjusting device as in the conventional art is not necessary. Therefore, the cost reduction and improvement of the operation efficiency in the manufacture of the piezoelectric vibrators 1.

Furthermore, since the necessity of storage of the individual piezoelectric vibrators 1 in the jigs and the frequency adjustment is eliminated, influence on the processing accuracy at the time of the frequency adjustment caused by variations of the dimensions of the jigs is eliminated. Therefore, the possibility of erroneous processing of the components of the piezoelectric vibrators 1 in the frequency adjustment is dramatically reduced, so that the higher quality of the piezoelectric vibrators 1 is achieved.

Also, the frequencies of the plurality of piezoelectric vibrating strips 4 encapsulated in the cavities C are measured simultaneously in the case of the fine adjustment step. Accordingly, the time period consumed for measuring the frequencies is reduced in the fine adjustment step is reduced, and the efficiency of the manufacture of the piezoelectric vibrators 1 can further be improved.

Also, since the gettering step is performed prior to the fine adjustment step, the degrees of vacuum in the interiors of the cavities C which cause an influence on the frequencies of the piezoelectric vibrating strips 4 in the cavities C are adjusted in advance at the time of fine adjustment step. Therefore, the frequencies of the piezoelectric vibrating strips 4 adjusted in the fine adjustment step are not affected by the gettering step, so that the piezoelectric vibrators 1 adjusted to an adequate frequency can be manufactured with the adequate series resonance resistance values secured.

Although the frequencies of the plurality of piezoelectric vibrating strips 4 encapsulated in the cavities C are measured simultaneously in this embodiment, the invention is not limited thereto.

Also, although the gettering step is performed prior to the fine adjustment step in this embodiment, the order of the both steps may be inverted. Also, although the external electrode forming step is performed prior to the fine adjustment step in this embodiment, the order of the both steps may be inverted.

Figure 28:
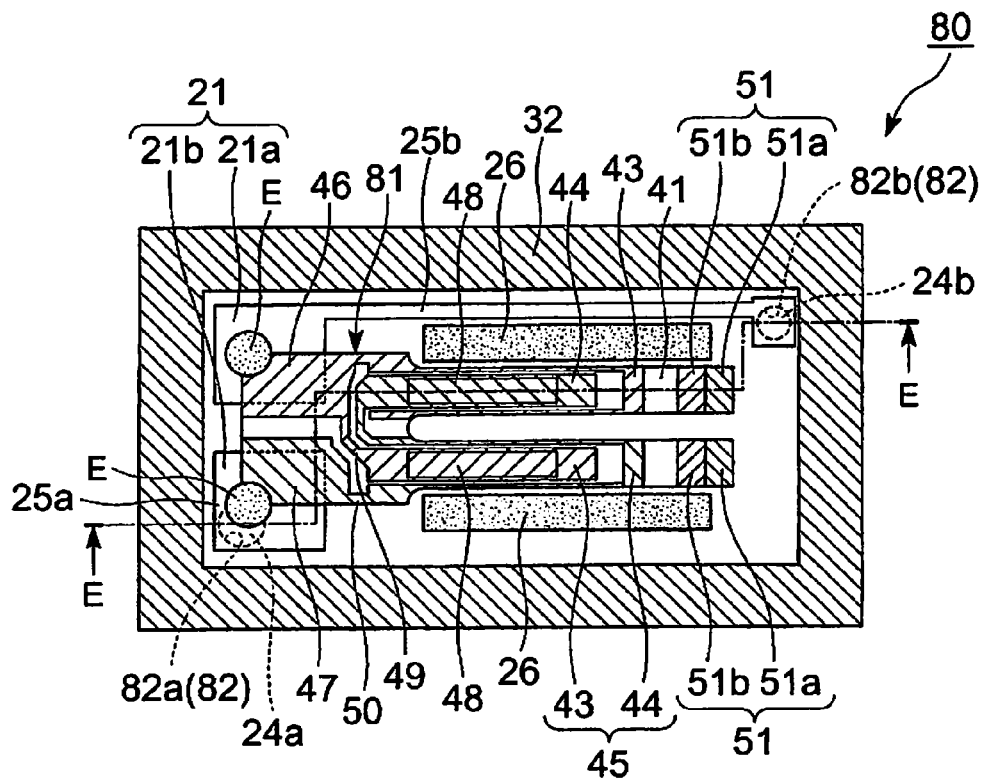
FIG. 28 is a drawing showing a modification of the piezoelectric vibrator manufactured by the piezoelectric vibrator manufacturing method according to the present invention with a lid substrate removed in a state of being viewed from above.
Figure 29:
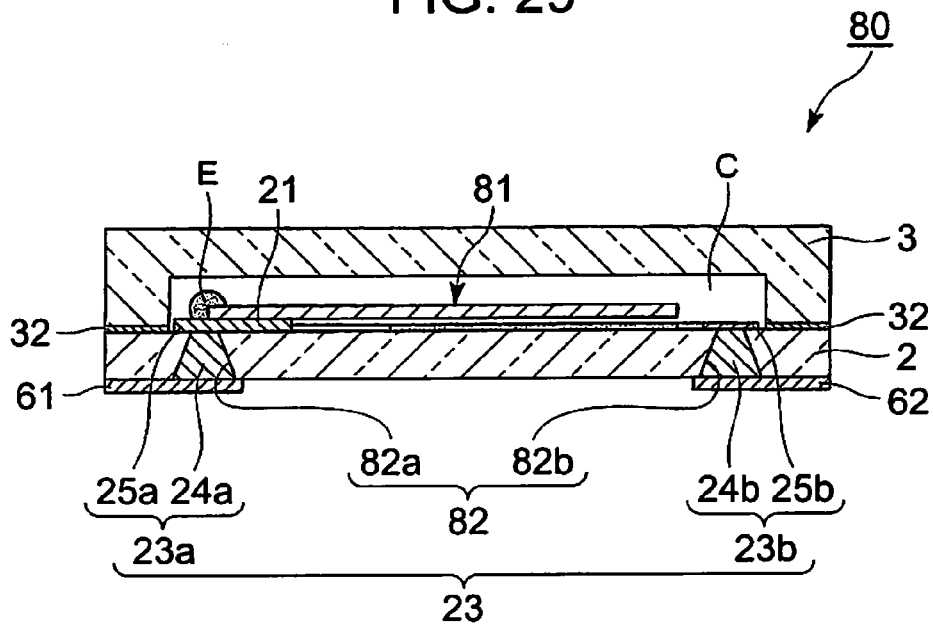
FIG. 29 is a cross-sectional view taken along an arrow E-E in FIG. 28.

Also, the piezoelectric vibrator manufactured in this embodiment may be configured as a piezoelectric vibrator 80 shown in FIG. 28 and FIG. 29.

In the piezoelectric vibrator 80 shown in FIG. 29, the second external electrode 62 as an external electrode formed on the side of the distal ends of the pair of vibrating arm portions 40, 41 of a piezoelectric vibrating strip 81 in vertical cross section does not overlap with the distal ends of the pair of vibrating arm portions 40, 41 when viewing the base substrate 2 from the bottom surface. In the illustrated example, overlap is avoided, for example, by forming the piezoelectric vibrating strip 81 to be smaller in the longitudinal direction X in comparison with the piezoelectric vibrating strip 4 of the piezoelectric vibrator 1 described above.

According to the piezoelectric vibrator 80 shown in FIG. 29, even when a weight metal film on the piezoelectric vibrating strip 81 is removed by irradiating the base substrate 2 (base substrate wafer 20) with a laser beam in the thickness direction thereof for adjusting the frequency, irradiation of the laser beam does not impaired by the second external electrode 62, so that the fine adjustment step can be performed easily and reliably.

Although the shape of a pair of through holes 82 in vertical cross section is tapered so as to increase in diameter gradually from the upper surface to the lower surface of the base substrate 2 in the piezoelectric vibrator 80 shown in FIG. 29, the invention is not limited thereto. For example, they may be the pair of through holes 22 having a straight shape in cross section shown in the piezoelectric vibrator 1 in the first embodiment and the second embodiment.

Furthermore, although the piezoelectric vibrator 80 shown in FIG. 29 is not formed with the notched portion 29 on the bottom surface of the base substrate 2 in contrast to the piezoelectric vibrator 1 in the first embodiment and the second embodiment, it may be formed thereon.

Figure 30:
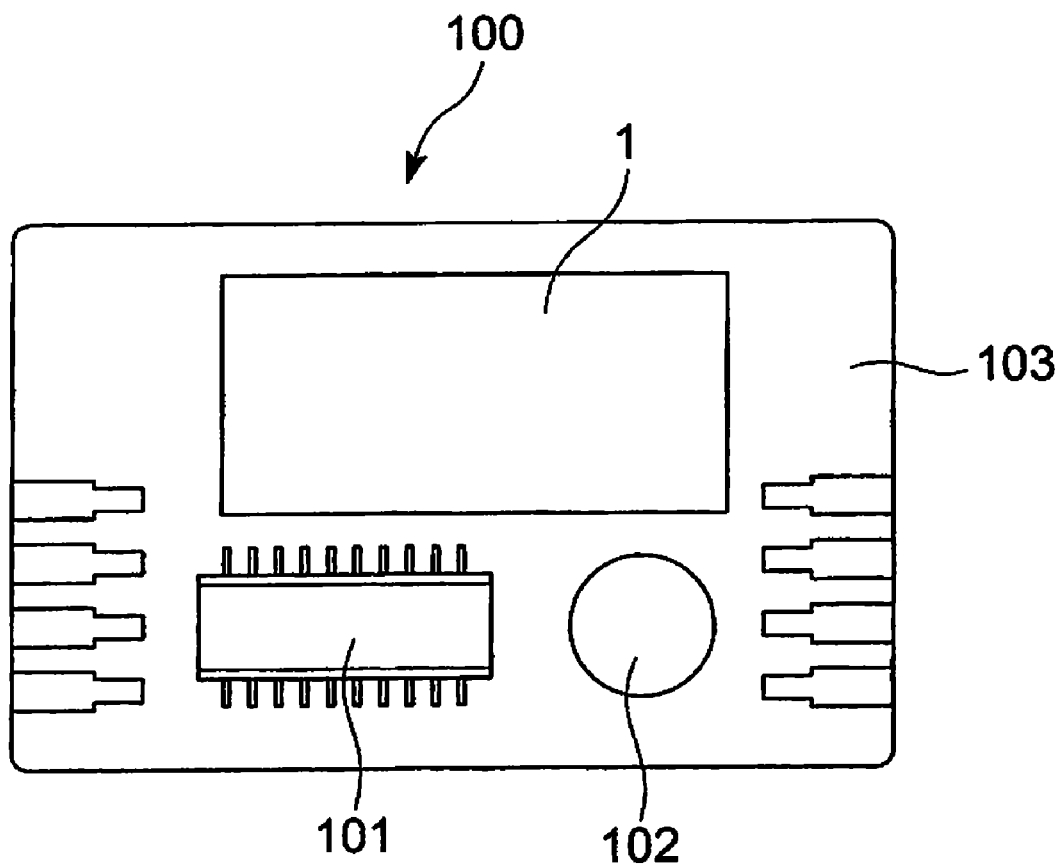
FIG. 30 is a configuration drawing of an oscillator according to an embodiment of the present invention.

Subsequently, an embodiment of an oscillator according to the present invention will be described with reference to FIG. 30. FIG. 30 is a drawing showing a configuration of the oscillator having the piezoelectric vibrator 1. In the respective embodiments shown below, a case where the piezoelectric vibrator 1 shown in the first to third embodiments is used as the piezoelectric vibrator is shown. However, the same effects and advantages are achieved also with the piezoelectric vibrator 80 shown as the modification of the third embodiment.

An oscillator 100 in this embodiment includes the piezoelectric vibrator 1 as an oscillating element electrically connected to an integrated circuit 101 as shown FIG. 30. The oscillator 100 includes a substrate 103 on which an electronic component 102 such as a capacitor is mounted. The integrated circuit 101 described above for the oscillator is mounted on the substrate 103, and the piezoelectric vibrator 1 is mounted in the vicinity of the integrated circuit 101. The electronic component 102, the integrated circuit 101, and the piezoelectric vibrator 1 are electrically connected to each other with a wring pattern, not shown. The respective components are molded by resin, not shown.

In the oscillator 100 configured as described above, when a voltage is applied to the piezoelectric vibrator 1, the piezoelectric vibrating strip 4 in the piezoelectric vibrator 1 vibrates, and this vibration is converted into an electric signal by a piezoelectric characteristic of the piezoelectric vibrating strip 4 and is inputted to the integrated circuit 101 as the electric signal. The inputted electric signal is subjected to various sorts of processing by the integrated circuit 101, and is outputted as a frequency signal. Accordingly, the piezoelectric vibrator 1 functions as the oscillating element.

Also, by selectively setting the configuration of the integrated circuit 101, for example, an RTC (real time clock) module or the like according to the requirement, not only a function as a single function oscillator for a clock, but also a function to control the date of operation or the time instant of the corresponding apparatus or an external apparatus or to provide the time instant or a calendar or the like of the same may be added.

As described above, according to the oscillator 100 in this embodiment, since the piezoelectric vibrator 1 improved in the quality, improved in the performance, reduced in the cost, and improved in the efficiency is provided, the oscillator 100 by itself is also improved in quality, improved in performance, reduced in cost, and improved in efficiency.

Subsequently, an embodiment of an electronic apparatus according to the present invention with reference to FIG. 31. As the electronic apparatus, a portable information device having the piezoelectric vibrator 1 described above will be exemplified for description. First of all, a portable information device 110 of this embodiment is represented, for example, by a mobile phone set, and development and improvement of a wrist watch in the related art are achieved. The appearance is similar to the wrist watch, a liquid crystal display is arranged on a portion corresponding to an hour plate, so that the current time instance or the like can be displayed on a screen thereof. When using as a communication instrument, it is removed from the wrist, and communication as achieved by the mobile phone set in the related art can be performed with a speaker and a microphone built in an inner portion of a band. However, downsizing and weight reduction are achieved significantly in comparison with the mobile phone set in the related art.

Figure 31:
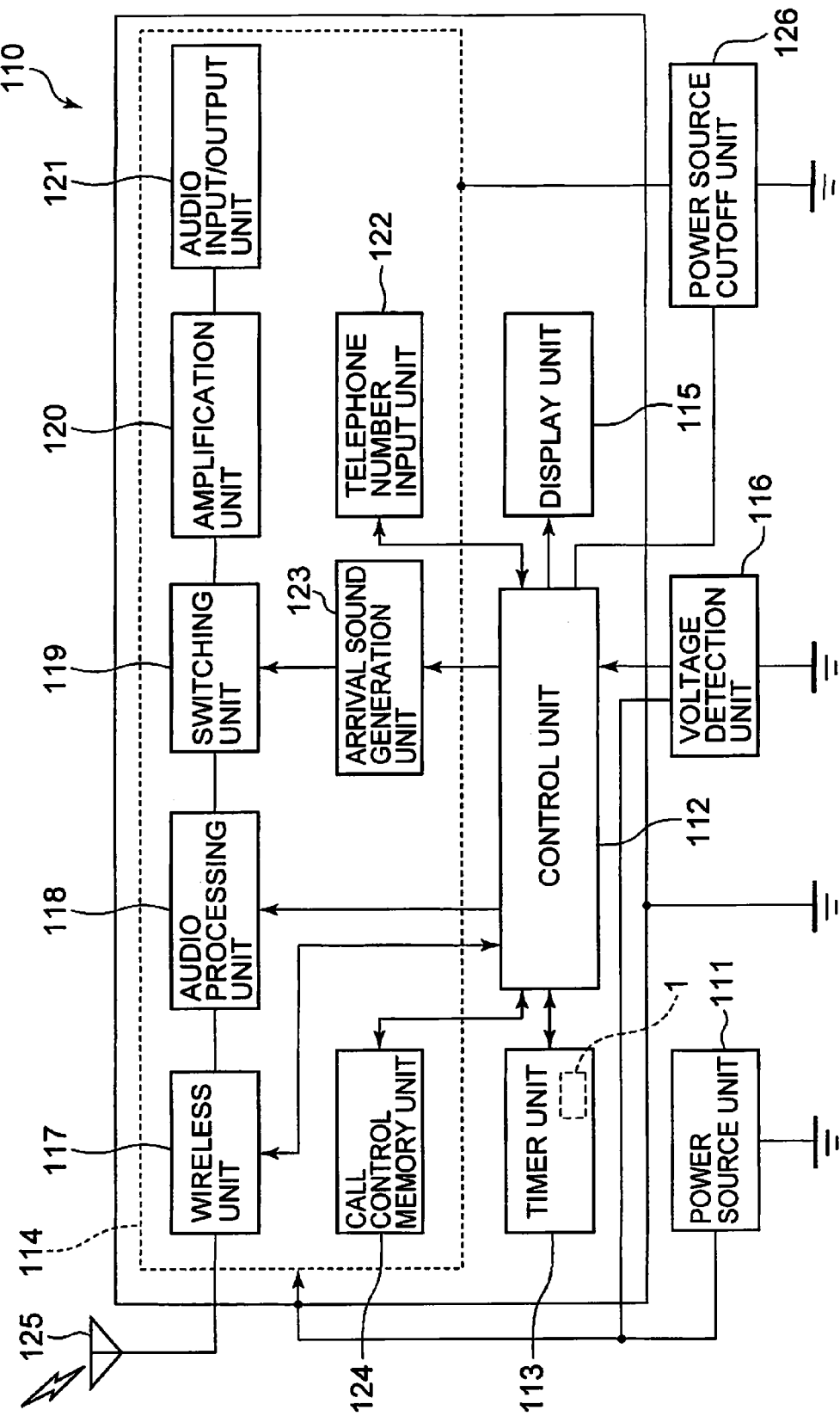
FIG. 31 is a configuration drawing of an electronic apparatus according to an embodiment of the present invention.

The portable information device (electronic apparatus) 110 in this embodiment includes the piezoelectric vibrator 1 and a power source unit 111 for supplying electric power as shown in FIG. 31. The power source unit 111 is composed, for example, of a lithium secondary battery. The power source unit 111 includes a control unit 112 configured to perform various types of control, a timer unit 113 configured to count the time instance or the like, a communication unit 114 configured to perform communication with the outside, a display unit 115 configured to display various types of information, and a voltage detecting unit 116 configured to detect the voltage of respective functioning units connected in parallel. The power source unit 111 is configured to supply the electric power to the respective functioning units.

The control unit 112 controls the respective functioning units to perform action control of an entire system such as sending and receiving of voice data, or measurement or display of the current time instance. Also, the control unit 112 includes a ROM in which a program is written in advance, a CPU configured to read and execute the program written in the ROM, and a RAM used as a work area of the CPU.

The timer unit 113 includes an integrated circuit having an oscillating circuit, a register circuit, a counter circuit, and an interface circuit integrated therein, and the piezoelectric vibrator 1. When a voltage is applied to the piezoelectric vibrator 1, the piezoelectric vibrating strip 4 vibrates, and this vibration is converted into an electric signal by a piezoelectric characteristic of the piezoelectric vibrating strip 4 and is inputted to the oscillating circuit as the electric signal. An output from the oscillating circuit is binarized, and is counted by the register circuit and the counter circuit. Then, sending and receiving of the signal with respect to the control unit 112 are performed via the interface circuit, and the current time instance, the current date, the calendar information, or the like are displayed on the display unit 115.

The communication unit 114 has the same function as the mobile phone set in the related art, and includes a wireless unit 117, a voice processing unit 118, a switching unit 119, an amplifying unit 120, a voice input and output unit 121, a telephone number input unit 122, an incoming call ring tone generating unit 123, and a calling control memory unit 124.

The wireless unit 117 sends and receives various data such as voice data with respect to a base station via an antenna 125. The voice processing unit 118 codes and decodes a voice signal inputted from the wireless unit 117 or the amplifying unit 120. The amplifying unit 120 amplifies a signal inputted from the voice processing unit 118 or the voice input and output unit 121 to a predetermined level. The voice input and output unit 121 includes a speaker and a microphone, and reinforces an incoming call ring tone or a receiving voice, or collects the voice.

Also, the incoming call ring tone generating unit 123 generates the incoming call ring tone according to a call from the base station. The switching unit 119 switches the amplifying unit 120 connected to the voice processing unit 118 to the incoming call ring tone generating unit 123 only at the time of the incoming call, so that the incoming call ring tone generated by the incoming call ring tone generating unit 123 is outputted to the voice input and output unit 121 via the amplifying unit 120.

The calling control memory unit 124 stores the program relating to communication dialing and incoming ring tone control. Also, the telephone number input unit 122 includes, for example, numeral keys from 0 to 9 and other keys, and a telephone number of a call target or the like is entered by pressing these numeral keys and the like.

The voltage detecting unit 116 detects a voltage drop when the voltage applied to the respective functioning units such as the control unit 112 or the like by the power source unit 111 falls below a predetermined value, and notifies it to the control unit 112. The predetermined voltage at this time is a value preset as a minimum voltage for stably operating the communication unit 114 and, for example, is on the order of 3V. The control unit 112, upon reception of the notification about the voltage drop from the voltage detecting unit 116, restricts the operations of the wireless unit 117, the voice processing unit 118, the switching unit 119, and the incoming call ring tone generating unit 123. In particular, the stop of the operation of the wireless unit 117 which consumes a large amount of power is essential. Furthermore, the fact that the communication unit 114 is disabled due to the short of the remaining amount of battery is displayed on the display unit 115.

In other words, the operation of the communication unit 114 may be restricted by the voltage detecting unit 116 and the control unit 112, and this may be displayed on the display unit 115. This display may be a text message, but may be a cross mark on a telephone icon displayed on an upper portion of a display surface of the display unit 115 as a further visceral display.

By providing a power source blocking unit 126 which is capable of selectively disconnect the power source of a portion relating to the function of the communication unit 114, the function of the communication unit 114 can be stopped further reliably.

As described above, according to the portable information device 110 in this embodiment, since the piezoelectric vibrator 1 improved in quality, improved in performance, reduced in cost, and improved in efficiency is provided, the portable information device 110 by itself is also improved in quality, improved in performance, reduced in cost, and improved in efficiency.

Figure 32:
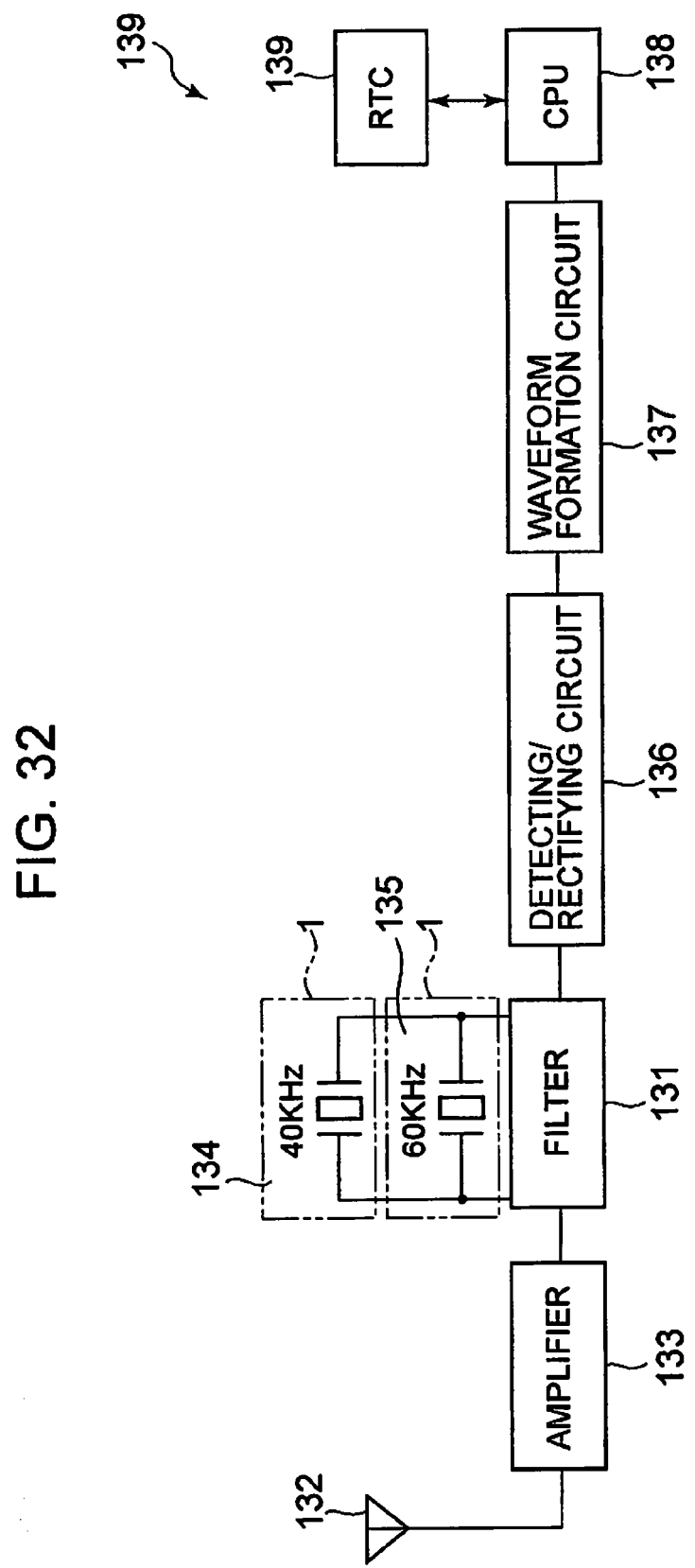
FIG. 32 is a configuration drawing of a radio clock according to an embodiment of the present invention.

Subsequently, an embodiment of a radio clock according to the present invention will be described with reference to FIG. 32. FIG. 32 is a drawing showing a configuration of the radio clock having the piezoelectric vibrator 1 described above.

A radio clock 130 includes the piezoelectric vibrator 1 electrically connected to a filtering unit 131 as shown in FIG. 32, and is a clock configured to receive a standard radio wave including a time information, correct the same to an accurate time instance and display the same.

In Japan, transmitter points (transmitter stations) which transmit the standard radio wave in Fukushima-ken (40 kHz) and Saga-ken (60 kHz), and these stations transmit the standard radio waves respectively. Long radio waves such as 40 kHz or 60 kHz have both a feature to propagate on the ground surface and a feature to propagate while being reflected between the ionosphere and the ground surface, it has a large propagation range, and hence Japan is entirely covered by the above-described two transmitter points.

A functional configuration of the radio clock 130 will be described with reference to FIG. 32.

An antenna 132 receives the long standard radio wave of 40 kHz or 60 kHz. The long standard radio wave is generated by AM modulating the time information referred to as a time code into a carrier wave of 40 kHz or 60 kHz. The received long standard radio wave is amplified by an amplifier 133 and filtered and synchronized by the filtering unit 131 having the plurality of piezoelectric vibrators 1.

The piezoelectric vibrators 1 in this embodiment each include piezoelectric vibrator portions 134, 135 having a resonance frequency of 40 kHz and 60 kHz which is the same as the carrier frequency.

Furthermore, a filtered signal having the predetermined frequency is detected and demodulated by a detecting and rectifying circuit 136. Subsequently, the time code is acquired via a waveform shaping circuit 137, and is counted by a CPU 138. In the CPU 138, data such as the current year, the total day, the day of the week, the time instance is read. The read data is reflected on an RTC 139, and the accurate time instance data is displayed.

Since the carrier wave is of 40 kHz or 60 kHz, the piezoelectric vibrator portions 134, 135 are preferably vibrators having the tuning fork type structure described above. When the frequency of 60 kHz is exemplified, as an example of dimensions of the tuning fork type vibrator strip, it may be configured in dimensions of approximately 2.8 mm in entire length and approximately 0.5 mm in width of the base portion 42.

As described above, according to the radio clock 130 in this embodiment, since the piezoelectric vibrator 1 improved in quality, improved in performance, reduced in cost, and improved in efficiency is provided, the radio clock 130 by itself is also improved in quality, improved in performance, reduced in cost, and improved in efficiency.

Although the embodiments of the present invention have been described in detail referring to the drawings, detailed configurations are not limited to these embodiments, and modifications in design without departing the scope of the invention are also included.

For example, in the respective embodiments described above, the depressions 31 and the bonding electrode film 32 for the cavities C are respectively formed on the lid substrate wafer 30. However, both of them may be formed on the base substrate wafer 20, and may be formed on the both wafers 20, 30.

Also, the piezoelectric vibrating strips 4, 81 are not specifically limited as long as the pair of mount electrodes 46, 47 electrically bonded to the pair of exciting electrodes 45 are provided.

Also, although the getter materials 26 are heated by the laser beam in the gettering step S51 in the respective embodiments describe above, the laser beam does not necessarily have to be employed.

Although the getter materials 26 are formed on the base substrate wafer 20 in the respective embodiments described above, it is not specifically limited as long as they are encapsulated in the cavities C.

What is claimed is:

1. A method for producing piezoelectric vibrators, comprising:
   (a) defining a plurality of first substrates on a first wafer and a plurality of second substrates on a second wafer;
   (b) layering the first and second wafers such that at least some of the first substrates substantially coincide respectively with at least some of the corresponding second substrates, with a piezoelectric vibrating strip being secured in a respective at least some of the coinciding first and second substrate pairs, wherein a getter material is placed inside a respective at least some of the coinciding first and second substrate pairs which each include the piezoelectric vibrating strip inside;

(c) anodically bonding at least some of the coinciding first and second substrate pairs which each include a getter material inside via a bonding electrode patterned between the first and second substrates, wherein at least some of the bonded first and second substrate pairs each have a pair of power-supply electrodes inside for supplying electricity to vibrate the piezoelectric vibrating strip therein, and the power-supply electrodes in a respective at least some of the bonded first and second substrate pairs which each include the pair of power-supply electrodes being electrically isolated from the bonding electrode patterned in the same first and second substrate pair and electrically accessible from outside of the substrates;

(d) supplying electricity to a respective at least some of the bonded first and second substrate pairs which each include the pair of power-supply electrodes via the power-supply electrodes to vibrate the piezoelectric vibrating strip inside and detecting a series resonance resistance of the vibrating piezoelectric vibrating strip;

(e) heating the getter material in a respective at least some of the bonded first and second substrate pairs to which electricity is supplied in order to adjust the detected series resonance resistance of the piezoelectric vibrating strip therein; and (f) after step (e) cutting off from the first and second wafers a respective at least some of the bonded first and second substrate pairs whose series resonance resistances is adjusted.

2. The method according to claim 1, further comprising, before step (b), adjusting a resonance frequency of at least some of the piezoelectric vibrating strips before the strips are placed between the first and second substrates.

3. The method according to claim 1, further comprising, before step (b), defining a bond area in the first and second substrates defined on the first and second wafers, wherein the first and second substrates are to be in bonding contact with each other in step (c) via the bond area.

4. The method according to claim 3, further comprising, before step (b), patterning the bonding electrode in the bond area of a respective at least some of the first substrates defined on the first wafer.

5. The method according to claim 3, further comprising, before step (b), forming a recess in a respective at least some of at least one of the first substrates and the second substrates to create a cavity between the bonded first and second substrates for storage of the piezoelectric vibrating strip therein.

6. The method according to claim 3, further comprising, before step (b), patterning the power-supply electrode, avoiding the bond area, on a respective at least some of one of the first substrates and the second substrates.

7. The method according to claim 1, wherein step (e) comprises irradiating a laser to the getter material from outside of the bonded substrates.

8. The method according to claim 1, wherein steps (d) and (e) are repeated more than one time.

9. The method according to claim 1, wherein step (d) comprises supplying electricity simultaneously to the at least some of the bonded first and second substrates which each include the power-supply electrodes to vibrate the piezoelectric vibrating strips therein and simultaneously detecting the series resonance resistances of at least some of the vibrating piezoelectric vibrating strips.

10. The method according to claim 1, further comprising after step (e):

(g) supplying electricity to a respective at least some of the bonded first and second substrate pairs which each include the pair of power-supply electrodes via the power-supply electrodes to vibrate the piezoelectric vibrating strip inside and detecting a frequency of the vibrating piezoelectric vibrating strip; and (h) changing a weight of a respective at least some of the piezoelectric vibrating strips to adjust the detected frequency of the piezoelectric vibrating strip.

11. The method according to claim 10, wherein step (h) comprises irradiating a laser to partially remove an adjustable weight of the piezoelectric vibrating strip.

12. The method according to claim 10, wherein steps (g) and (h) are performed before step (f).

13. The method according to claim 10, wherein steps (g) and (h) are performed after step (f).

14. The method according to claim 1, further comprising after step (c) forming external electrodes to at least some pairs of the bonded first and second substrates.

15. The method according to claim 14, wherein step (i) is performed before step (d).

16. The method according to claim 14, wherein step (i) is performed after step (f).

* * * * *

UNITED STATES PATENT AND TRADEMARK OFFICE
CERTIFICATE OF CORRECTION

| | |
|---|---|
| PATENT NO. | : 8,087,135 B2 |
| APPLICATION NO. | : 12/792167 |
| DATED | : January 3, 2012 |
| INVENTOR(S) | : Keiichi Ouchi et al. |

It is certified that error appears in the above-identified patent and that said Letters Patent is hereby corrected as shown below:

In the Claims

In column 29, claim 1, line 16, before "and electrically accessible" replace "pair" with --pairs--.

In column 29, claim 1, line 30, immediately after "after step (e)" insert --,--.

In column 30, claim 14, line 40, after "step (c)" begin a new paragraph, and insert --(i)-- before "forming external electrodes".

Signed and Sealed this
Twenty-second Day of May, 2012

David J. Kappos
*Director of the United States Patent and Trademark Office*